(12) United States Patent
Kitamura et al.

(10) Patent No.: US 8,084,812 B2
(45) Date of Patent: Dec. 27, 2011

(54) BIDIRECTIONAL SEMICONDUCTOR DEVICE, METHOD OF FABRICATING THE SAME, AND SEMICONDUCTOR DEVICE INCORPORATING THE SAME

(75) Inventors: Mutsumi Kitamura, Nagano (JP); Naoto Fujishima, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 12/612,243

(22) Filed: Nov. 4, 2009

(65) Prior Publication Data
US 2010/0044749 A1 Feb. 25, 2010

Related U.S. Application Data

(63) Continuation of application No. 10/918,705, filed on Aug. 16, 2004, now Pat. No. 7,902,596.

(30) Foreign Application Priority Data

Feb. 16, 2004 (JP) ................................. 2004-038698

(51) Int. Cl.
*H01L 31/119* (2006.01)
(52) U.S. Cl. .. 257/329; 257/330; 257/331; 257/E29.262
(58) Field of Classification Search ........... 257/329–331
See application file for complete search history.

(56) References Cited

U.S. PATENT DOCUMENTS

| | | | |
|---|---|---|---|
| 4,546,367 A | 10/1985 | Schutten et al. | |
| 4,612,465 A | 9/1986 | Schutten et al. | |
| 5,122,848 A | 6/1992 | Lee et al. | |
| 5,701,026 A | 12/1997 | Fujishima et al. | |
| 5,885,878 A | 3/1999 | Fujishima et al. | |
| 6,097,049 A | 8/2000 | Goebel et al. | |
| 6,211,551 B1 | 4/2001 | Suzumura et al. | |
| 6,316,807 B1 | 11/2001 | Fujishima et al. | |
| 6,624,470 B2 | 9/2003 | Fujishima et al. | |

(Continued)

FOREIGN PATENT DOCUMENTS

JP 62-031167 A 2/1987

(Continued)

OTHER PUBLICATIONS

Office Action issued in corresponding Japanese Patent Application No. 2004-038698 dated Feb. 9, 2010.

(Continued)

*Primary Examiner* — Samuel Gebremariam
(74) *Attorney, Agent, or Firm* — Rossi, Kimms & McDowell LLP

(57) ABSTRACT

A semiconductor device and a method of fabrication thereof includes a bidirectional device having a high breakdown voltage and a decreased ON voltage. An n-type extended drain region is formed in the bottom surface of each trench. A p-type offset region is formed in each split semiconductor region. First and second n-source regions are formed in the surface of the p-type offset region. This reduces the in-plane distance between the first and second n-source regions to thereby increase the density of cells. The breakdown voltage is maintained along the trenches. This increases the resistance to high voltages. Channels are formed in the sidewalls of the trenches by making the voltage across each gate electrode higher than the voltage across each of the first and second n-source electrodes. Thus, a bidirectional LMOSFET through which current flows in both directions is achieved. The LMOSFET has a high breakdown voltage and a decreased ON voltage.

3 Claims, 24 Drawing Sheets

U.S. PATENT DOCUMENTS

| | | | |
|---|---|---|---|
| 6,639,274 B2 | 10/2003 | Fujishima et al. | |
| 6,664,163 B2 | 12/2003 | Fujishima et al. | |
| 6,781,197 B2 | 8/2004 | Fujishima et al. | |
| 6,919,599 B2 | 7/2005 | Henson | |
| 2002/0030231 A1* | 3/2002 | Okawa et al. | 257/355 |
| 2002/0140026 A1 | 10/2002 | Ishikawa et al. | |
| 2002/0158287 A1 | 10/2002 | Fujishima et al. | |
| 2002/0175365 A1* | 11/2002 | Hirayama | 257/329 |
| 2003/0107080 A1* | 6/2003 | Hshieh et al. | 257/330 |

FOREIGN PATENT DOCUMENTS

| | | |
|---|---|---|
| JP | 62-31167 A | 2/1987 |
| JP | 62-032649 A | 2/1987 |
| JP | S62-29173 A | 2/1987 |
| JP | S62-31167 A | 2/1987 |
| JP | 8-32060 A | 2/1996 |
| JP | 8-181313 A | 7/1996 |
| JP | 11-224950 A | 8/1999 |
| JP | 2002-526930 A | 8/2002 |
| JP | 2002-280549 A | 9/2002 |
| WO | 00/19540 A1 | 4/2000 |
| WO | 00/52760 A1 | 9/2000 |

OTHER PUBLICATIONS

First Office Action issued in corresponding Chinese Patent Application No. 2004100551886 dated Jun. 6, 2008. Partial English translation provided.

Parthasarathy, V. et al.; "A 0.35 um CMOS based smart power technology for 7V-50V applications"; ISPSD 2000 Copyright 2000 by the IEEE; Catalog No. 00CH37094C; 4 pages.

Xu, Shuming et al.; "Bidirectional LIGBT on SOI Substrate with High Frequency and High Temperature Capability"; 1997, IEEE, pp. 37-30.

Notification of Second Office Action issued in corresponding Chinese Patent Application No. 2004100551886 dated Jan. 23, 2009. Partial English translation provided.

Notification of Reasons for Refusal issued in corresponding Japanese Patent Application No. 2004-038698 dated Sep. 14, 2010. Partial English translation provided.

Japanese Office Action mailed Jun. 14, 2011 for corresponding Japanese Application. Partial translation of "Notification of Reasons for Refusal" provided.

* cited by examiner

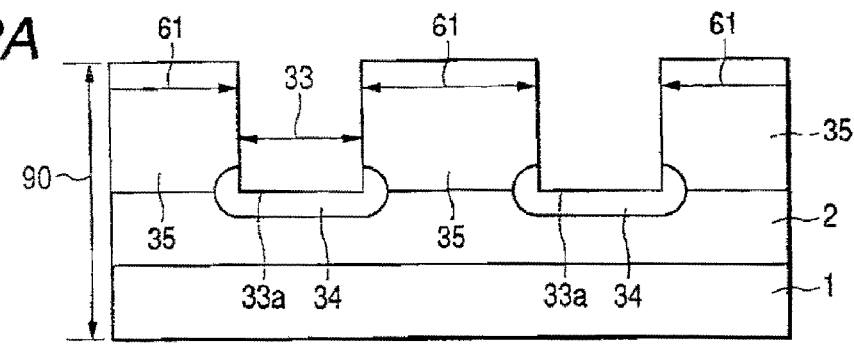
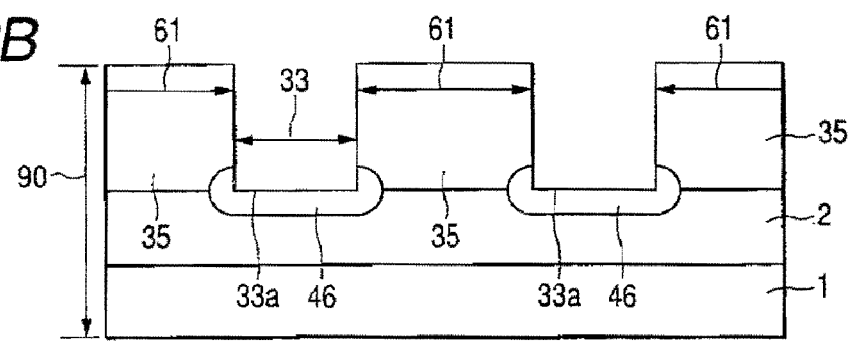
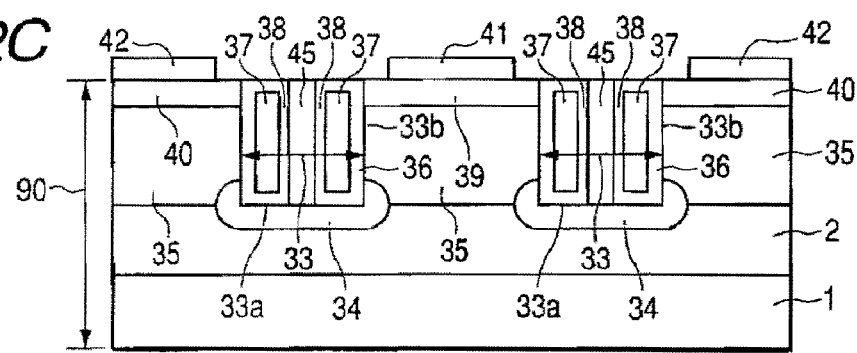
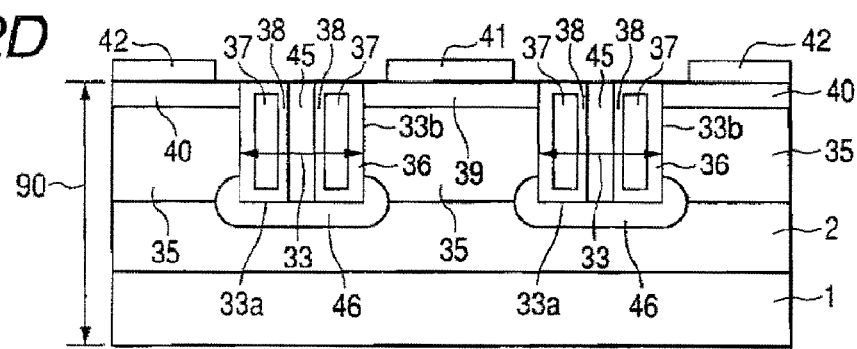

BIDIRECTIONAL SEMICONDUCTOR DEVICE, METHOD OF FABRICATING THE SAME, AND SEMICONDUCTOR DEVICE INCORPORATING THE SAME

CROSS REFERENCE TO RELATED APPLICATION

This is a continuation of and claims priority from U.S. patent application Ser. No. 10/918,705 filed Aug. 16, 2004, the content of which is incorporated herein by reference.

BACKGROUND

A power supply device, such as a battery, needs to be controlled when the battery is charged and when the battery is discharged (i.e., electrical current is supplied to the load) to prevent overcharging and overdischarging of the battery. Therefore, bidirectional semiconductor switches that can turn ON and OFF an AC signal or AC power are necessary. A composite bidirectional device consisting of a reverse parallel combination of unidirectional semiconductor devices has been used as such a bidirectional semiconductor switch. Furthermore, it has been attempted to provide a miniaturized power supply device using a power IC consisting of a semiconductor substrate on which such a composite directional device and an IC for controlling it are integrated. In addition, a single (i.e., noncomposite) bidirectional device has been developed. In this respect, a bidirectional lateral insulated gate bipolar transistor (LIGBT) has been proposed in ISPSD (International Symposium on Power Semiconductor Devices and ICs) 1997, pp. 37-40, for example. The structure and operation of the bidirectional LIGBT are described below.

FIG. 30 is a cross-sectional view of main portions of the bidirectional LIGBT. In the bidirectional LIGBT, two $p^+$ well regions 504 and 505 are formed on the surface side of an n-type semiconductor layer 503, and $n^+$ emitter regions 506 and 507 are formed in the $p^+$ well regions 504 and 505, respectively. The $p^+$ well regions 504 and 505 are formed with their surfaces exposed on the surface of the n-type semiconductor layer 503, and are spaced from each other by a given or predetermined distance (drift distance) to maintain a given breakdown voltage. Furthermore, the $n^+$ emitter regions 506 and 507 are formed with their surfaces exposed on the surface of the n-type semiconductor layer 503 (i.e., the surfaces of the $p^+$ well regions 504 and 505).

Insulated-gate type gate electrodes 510 and 511 consisting of polysilicon are formed over the portion located between the two $n^+$ emitter regions 506 and 507 of the $p^+$ well regions 504 and 505 via gate insulator films 508 and 509. Furthermore, emitter electrodes 512 and 513 are formed to bridge across both the $p^+$ well region 504 and the $n^+$ emitter region 506 and across both the $p^+$ well region 505 and the $n^+$ emitter region 507. In this configuration, the main current flowing in both directions between the emitter electrodes 512 and 513 can be controllably turned ON and OFF by controlling the voltage applied to the gate electrodes 510 and 511.

FIG. 31 is a diagram showing the output characteristics of the bidirectional LIGBT of FIG. 30. Since the main current does not begin to flow unless the voltage exceeds the rising voltage (0.6 V) arising from the internal potential of the pn-junction, the ON voltage is high and ON loss is large at a small current region. As an improvement of the configuration of FIG. 30, a single bidirectional MOSFET comprising a bidirectional device consisting of a MOSFET whose voltage decreases down to 0 V when the device is started to be operated is described, for example, in JP-A-11-224950, which is described below.

FIG. 32 is a cross section of main portions of the related art bidirectional MOSFET. Here, a bidirectional LDMOSFET (lateral double-diffused MOSFET) is shown as an example. In the same way as the above-described example, this transistor has an SOI structure. An n-type semiconductor layer 103 is formed over a semiconductor substrate 101 with an insulator layer 102 formed therebetween. Two $n^{++}$ drain regions 104 and 105 are formed on the surface side of the n-type semiconductor layer 103. A $p^+$ well region 106 is formed between the $n^{++}$ drain regions 104 and 105. The $p^+$ well region 106 is formed to a depth reaching the insulator layer 102, dividing the n-type semiconductor layer 103 into two regions. Two n++source regions 107 and 108 are formed in the $p^+$ well region 106. A $p^{++}$ base contact region 109 is formed between both the $n^{++}$ source regions 107 and 108. The $n^{++}$ drain regions 104, 105 and the $p^+$ well region 106 are exposed on the surface of the n-type semiconductor layer 103. The $n^{++}$ source regions 107, 108 and $p^{++}$ base contact region 109 are exposed on the surface of the $p^+$ well region 106. Insulated-gate type gate electrodes 112 and 113 are formed over the $p^+$ well region 106 with gate insulator films 110 and 111 formed therebetween. The gate electrodes 112 and 113 are connected together. Drain electrodes 114 and 115 are connected with the $n^{++}$ drain regions 104 and 105, respectively. A source electrode 117 is connected across both the n++source region 107 and the $p^{++}$ base contact region 109 and across both the $n^{++}$ source region 108 and the $p^{++}$ base contact region 109.

To turn ON the aforementioned bidirectional LDMOSFET, a voltage is applied between the gate electrode 112 and the source electrode 117 and between the gate electrode 113 and the source electrode 117 such that the gate electrodes 112 and 113 are placed at a positive potential. At this time, channels are formed immediately under the gate insulator films 110 and 111 in the $p^+$ well region 106. If it is assumed that a voltage is applied between the drain electrodes 114 and 115 to place the drain electrode 114 at a higher potential, an electron current flows from the drain electrode 114 to the drain electrode 115 via the $n^{++}$ drain region 104, the n-type semiconductor layer 103, the channel corresponding to the gate electrode 112, the n++source region 107, the source electrode 117, the $n^{++}$ source region 108, the channel corresponding to the gate electrode 113, the n-type semiconductor layer 103, and the $n^{++}$ drain region 105 in this order. At this time, the electron current dominates the electrical current, i.e., unipolar. Since there is no junction in the current path, no offset component is produced even at low potentials. That is, the linearity becomes good even at very small currents. Where the polarity of the voltage applied between the drain electrodes 114 and 115 is reversed, the sense of the current is reversed but the operation is similar. As a result, as shown in FIG. 33, an AC current can be supplied. It also can be expected that operation of good linearity occurs even at very small currents.

On the other hand, in order to turn OFF the above-described bidirectional LDMOSFET, the gate electrodes 112 and 113 are shorted to the source electrode 117. This annihilates the channels formed immediately under the gate insulator films 110 and 111 in the $p^+$ well region 106. The electron current no longer flows and hence the device is turned OFF. In the OFF state, no current flows even if either positive or negative voltage is applied between the drain electrodes 114 and 115. That is, the device takes an OFF state for AC voltage.

Under this state, the breakdown voltage is equal to the breakdown voltage of a half portion of the bidirectional LDMOSFET.

The AC power can be turned ON and OFF with one chip using the bidirectional LDMOSFET. Furthermore, during conduction, the linearity of the voltage-to-current characteristics is good even at very small currents. The device can be used to turn ON and OFF a signal current. In addition, the gate electrodes 112 and 113 are connected together, and there is only one source electrode 117. Therefore, only one driver circuit is necessary to supply a control signal to the gates. Consequently, the device becomes easy to control.

As mentioned previously, the main current flows through the channels without via a pn junction. Therefore, the main current is fundamentally the same as the current flowing through a resistor. The current flows at zero or higher voltage. The ON voltage is small at small currents, and thus the ON loss can be reduced. However, in the bidirectional LDMOSFET of FIG. 32, the breakdown voltage is sustained by one MOSFET of the bidirectional LDMOSFET. Therefore, to sustain forward-reverse breakdown voltages, both MOSFETs are required to show breakdown voltage. Hence, the area occupied is doubled. This increases the area occupied between the drain regions. Furthermore, the planar structure makes it difficult to reduce the size of cells forming the bidirectional LDMOSFETs. Accordingly, it is difficult to improve the ON voltage.

Accordingly, there still remains a need for a semiconductor device with high breakdown voltage, with the reduced ON voltage without the foregoing problems and while increasing the cell density of the bidirectional device.

SUMMARY OF THE INVENTION

The present invention relates to a semiconductor device such as a power integrated circuit (power IC) having a bidirectional device and to a method of fabricating the semiconductor device.

One aspect of the present invention is a bidirectional semiconductor device, which includes a semiconductor region of a first conductivity type. A plurality of spaced trenches can extend from a surface of the semiconductor region to split the semiconductor region into first and second split semiconductor regions. First regions of the first conductivity type can be formed at least in the bottom surfaces of the trenches. That is, the first regions can be formed in the sidewalls of the trenches and/or bottom surfaces thereof. Second and third regions of a second conductivity type can be formed in the first and second split semiconductor regions, respectively, with the second and third regions contacting the sidewalls of the trenches and the first regions. Fourth regions of the first conductivity type can be formed in the first split semiconductor regions and in contact with the sidewalls of the trenches and with the second region. Fifth regions of the first conductivity type can be formed in the second split semiconductor regions and in contact with the sidewalls of the trenches and with the third regions. First control electrodes can be formed on the sidewalls of the trenches in the first split semiconductor regions and can extend from the first regions to the fourth regions with a first insulator film interposed therebetween. Second control electrodes can be formed on the sidewalls of the trenches in the second split semiconductor regions and can extend from the first regions to the fifth regions with a second insulator film interposed therebetween. First main electrodes can be formed on the fourth regions and second main electrodes can be formed on the fifth regions.

Sixth regions having a lower dopant concentration than the first regions can be formed between the first and second regions and between the first and third regions. The first and second control electrodes can be connected electrically or insulated electrically. The semiconductor regions can be formed in a semiconductor substrate of the second conductivity type. Each of the first and second split semiconductor regions can be plural in number. The first and second split semiconductor regions can be formed adjacently to each other. The trench width between adjacent split semiconductor regions of different types can be greater than the trench width between adjacent split semiconductor regions of the same type. The first and second main electrodes can be electrically connected with the second and third regions, respectively.

A conductor can be formed inside of each of the control electrodes, with the conductor reaching into the first region via an interlayer dielectric film. A seventh region of the second conductivity type can be formed in the bottom surface of each trench and in contact with the second and third regions and with the conductor.

Another aspect of the present invention is a semiconductor device that includes the bidirectional semiconductor device described above and a control circuit for controlling the bidirectional device formed on the same semiconductor substrate.

Another aspect of the present invention is a method of manufacturing the device described above. The method can comprise the following steps. A semiconductor region of a first conductivity type is formed. Thereafter, a diffusion region of a second conductivity type can be formed in the semiconductor layer. Thereafter, trenches can be formed from the surface of the diffusion region to form first and second split semiconductor regions surrounded by the trenches. First regions of the first conductivity type can be formed from the bottom surface of each trench by diffusion such that the first regions are connected with the semiconductor region. Second regions of the first conductivity type can be formed within the first split semiconductor regions from the diffusion region, and with the second regions surrounded by the trenches and contacting the sidewalls of the trenches. Similarly, third regions of the first conductivity type within the second split semiconductor region from the diffusion region, and with the third regions surrounded by the trenches and contacting the sidewalls of the trenches. First control electrodes can be formed on the sidewall of the trenches in the first split semiconductor regions such that the first control electrodes extend from the first regions to the second regions with a dielectric film interposed therebetween. Second control electrodes can be formed on the sidewalls of the trenches in the second split semiconductor regions such that the second control electrodes extend from the first regions to the third regions with a dielectric film interposed therebetween. First main electrodes can be formed on the fourth regions and second main electrodes can be formed on the fifth regions.

According to another aspect of the manufacturing method, the trenches can be formed from the surface of the semiconductor region to form the first and second split semiconductor regions surrounded by the trenches. The diffusion region of the second conductivity type can be formed in the surface of the semiconductor region to form second and third regions of the second conductivity type in the first and second split semiconductor regions, respectively, with the second and third regions in contact with the sidewalls of the trenches. The first regions of the first conductivity type can be formed from the bottom surfaces of the trenches by diffusion such that the first regions are connected with the semiconductor region. Fourth regions of the first conductivity type can be formed within the first split semiconductor regions from the second region, and surrounded by the trenches such that the fourth regions are in contact with the sidewalls of the trenches. Fifth regions of the first conductivity type can be formed within the second split semiconductor region from the third regions, and surrounded by the trenches such that the fifth regions are in contact with the sidewalls of the trenches. The first control electrodes can be formed on the sidewalls of the trenches in the first split semiconductor regions such that the first control electrodes extend from the first regions to the fourth regions with a dielectric film interposed therebetween. The second control electrodes can be formed on the sidewalls of the trenches in the second split semiconductor regions such that the second control electrodes extend from the first regions to the fifth regions with a dielectric film interposed therebetween. The first main electrodes can be formed on the fourth regions and the second main electrodes can be formed on the fifth regions.

The trenches can reach into the semiconductor region and the first regions can be formed within the semiconductor region. The first region can be connected with the diffusion region or the second and third regions. An interlayer dielectric film can be formed between the first and second control electrodes. Openings can be formed in the interlayer dielectric film such that the openings reach into the first regions, and the openings can be filled with a conductor.

Fourth or sixth regions of the second conductivity type can be formed in the bottom surfaces of the trench such that the fourth or sixth regions are adjacent to the first regions and in contact with the diffusion region or the second and third regions. Each of the first and second split semiconductor regions can be plural in number.

Each trench between the first and second split semiconductor regions is herein referred to as the first trench. The trench between the first split semiconductor regions and the trench between the second split semiconductor regions are herein referred to as the second trenches. The first trenches can be set wider than the second trenches. That is, the trenches between the first and second split semiconductor regions can be made wider than the trenches between the first split semiconductor regions and the trenches between the second split semiconductor regions.

BRIEF DESCRIPTION OF THE DRAWINGS

FIG. 1A illustrates a plan view of main portions thereof, FIG. 1B illustrates an enlarged view of portion A of FIG. 1A, and FIG. 1C illustrates a cross-sectional view of the main portions taken along line 1C-1C of FIG. 1B.

FIG. 2A illustrates an n-well region also acting as n-drain regions 4 of FIG. 1C, FIG. 2B illustrates a semiconductor substrate 1 also acting as the n-drain regions of FIG. 1C, and FIG. 2C illustrates n-drain regions 4 additionally formed in FIG. 2B.

FIG. 4A illustrates a plan view of the main portions corresponding to FIG. 1B and FIG. 4B illustrates a cross section of the main portions taken along line 4B-4B of FIG. 4A.

FIG. 5A illustrates a plan view of the main portions, FIG. 5B illustrates an enlarged view of portion B of FIG. 5A, and FIG. 5C illustrates a cross section of the main portions taken along line 5C-5C of FIG. 5B.

FIG. 7A illustrates a plan view of the main portions corresponding to FIG. 5B, FIG. 7B illustrates a cross section of the main portions taken along line 7B-7B of FIG. 7A, and FIG. 7C is a cross section of the main portions taken along line 7C-7C of FIG. 7A.

FIGS. 12A-12C schematically illustrate alternative method of fabricating the semiconductor device of FIGS. 7A-7C, where FIGS. 12A and 12B illustrate cross sections of the main portions illustrating the fabrication steps corresponding to FIG. 11A, and FIGS. 12C and 12D illustrate cross sections of the main portions illustrating the fabrication steps corresponding to FIG. 11C.

FIG. 26A illustrates a cross section of a portion corresponding to FIG. 22, FIG. 26B illustrates a cross section of a portion corresponding to FIG. 23, and FIG. 26C illustrates a cross section of a portion corresponding to FIG. 24.

FIG. 27A illustrates a cross section of a portion corresponding to FIG. 22, FIG. 27B illustrates a cross section of a portion corresponding to FIG. 23, and FIG. 27C illustrates a cross section of a portion corresponding to FIG. 24.

FIG. 28A illustrates a cross section of a portion corresponding to FIG. 22, FIG. 28B illustrates a cross section of a portion corresponding to FIG. 23, and FIG. 28C illustrates a cross section of a portion corresponding to FIG. 24.

FIG. 29A illustrates a cross section of a portion corresponding to FIG. 22, FIG. 29B illustrates a cross section of a portion corresponding to FIG. 23, and FIG. 29C illustrates a cross section of a portion corresponding to FIG. 24.

DETAILED DESCRIPTION

The present description associates the first conductivity type with the n type, while associating the second conductivity type as the p type. These types, however, can be interchanged.

Figure 1A:
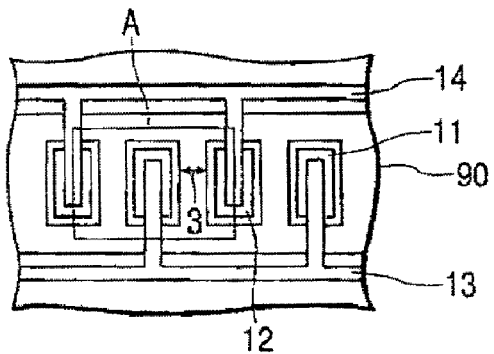
FIGS. 1A-1C schematically illustrate a first embodiment of a semiconductor device according to the present invention, where
Figure 1B:
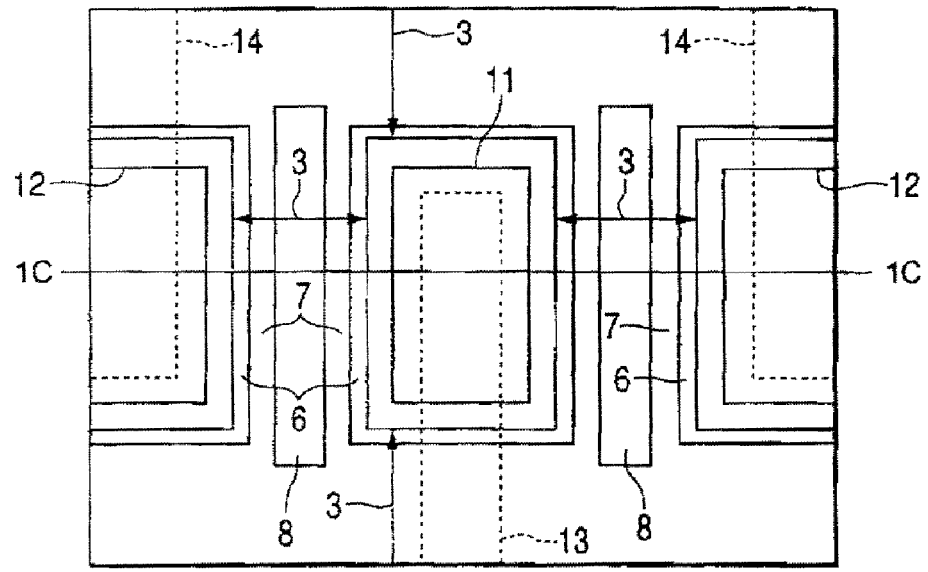
Figure 1C:
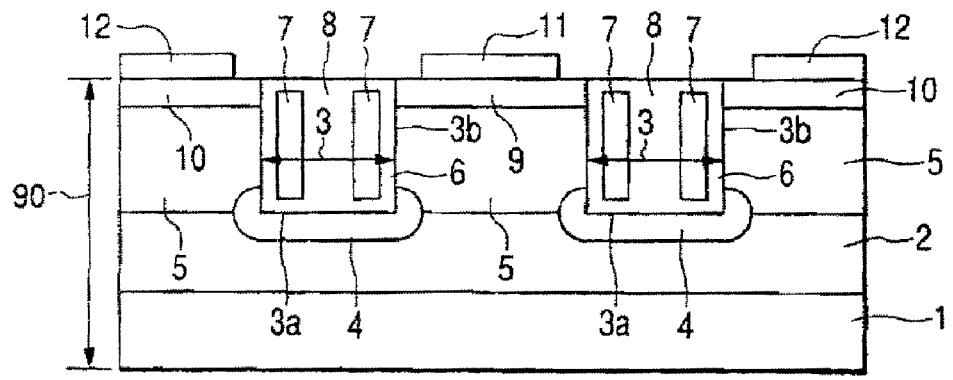

FIGS. 1A-1C schematically illustrate a first embodiment of a semiconductor device according to the present invention. In this embodiment, a bidirectional LMOSFET (bidirectional lateral MOSFET) is taken as an example. This bidirectional LMOSFET is similar to a TLPM (trench lateral power MOSFET) in structure. An n-well region 2 is formed on a p-type semiconductor substrate 1. Trenches 3 are formed in the n-well region 2. Then, n-drain regions 4 are formed under the bottom surfaces 3a of the trenches. A p-type offset region 5 is formed in the surface of the n-well region 2.

Figure 2A:
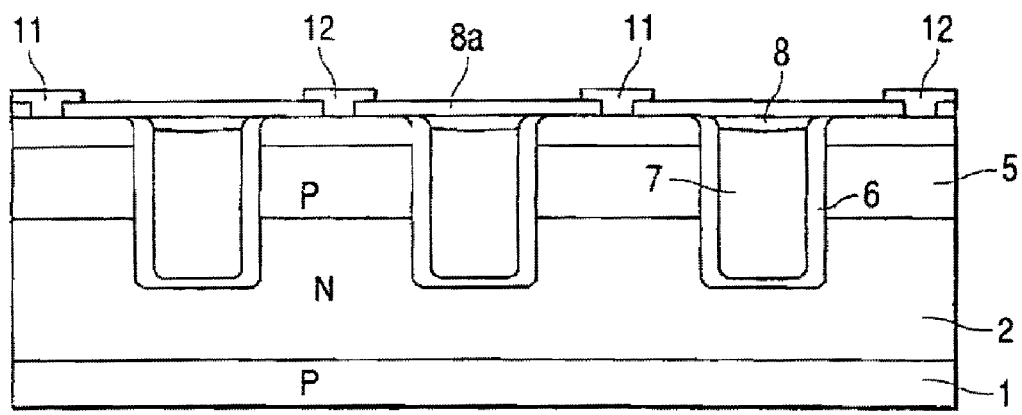
FIGS. 2A-2C schematically illustrate an alternative configuration of the device of FIGS. 1A-1C, where
Figure 2B:
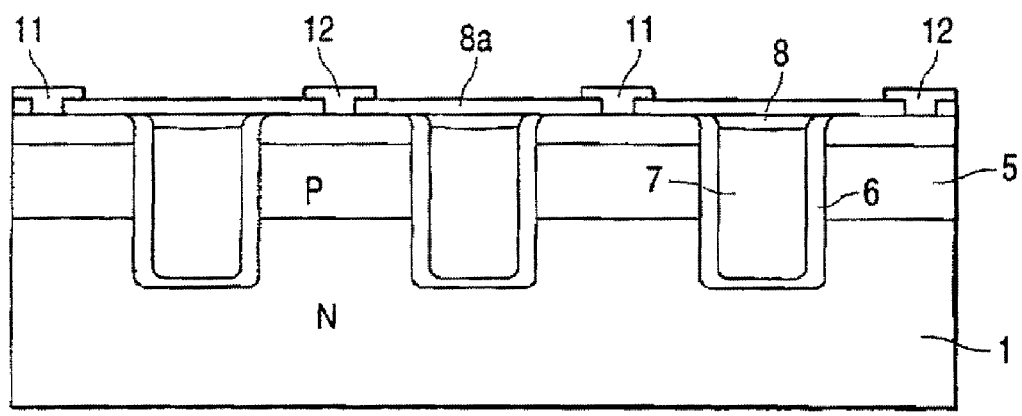
Figure 2C:
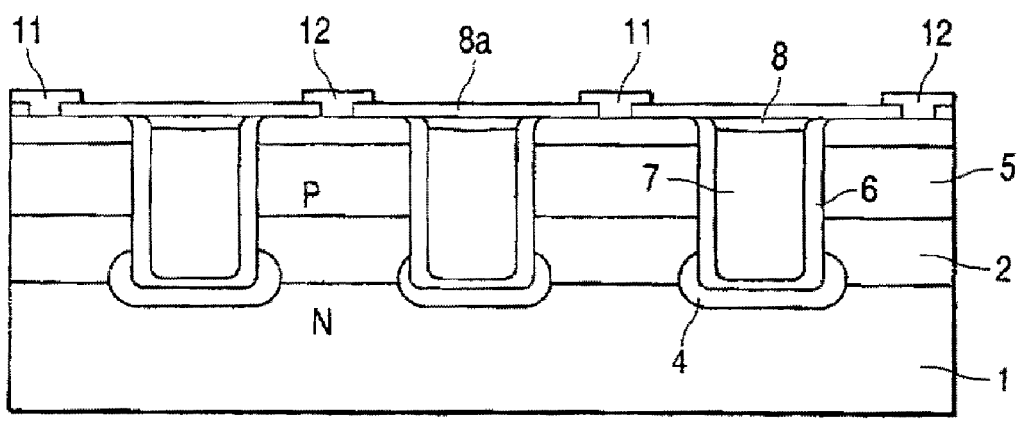

A gate insulator film 6 is formed on the inner wall of each trench 3. Gate electrodes 7 are formed over the sidewalls 3b of the trenches with the gate insulator film formed therebetween. First n-source regions 9 and second n-source regions 10 are selectively formed on the surface of the p-type offset region 5 surrounded by the trenches 3 such that the n-source regions 9 and 10 are in contact with the trenches 3. The first n-source regions 9 and the second n-source regions 10 are formed alternately with the intervening trenches 3 therebetween. The upper sides of the gate electrodes 7 and the inside of each trench 3 are filled with an interlayer dielectric film 8, thus achieving planarization. The interlayer dielectric film 8a can be formed over the entire surface, such as illustrated in FIGS. 2A-2C, and then contact holes can be formed therethrough. First source electrodes 11 and second source electrodes 12 are formed over the first n-source regions 9 and the second n-source regions 10, respectively. The first source electrodes 11 are connected by first source interconnects 13. The second source electrodes 12 are connected by second source interconnects 14. The gate electrodes 7 are connected with gate pads (not shown) via gate interconnects.

The n-drain regions 4 formed in the bottoms of the trenches as described previously mitigates the electric field, and a high breakdown voltage of about 30 V can be secured. Furthermore, as the gate electrodes 7 and n-drain regions 4 are formed in the bottoms of the trenches 3, a high breakdown voltage can be maintained along the trenches 3. Consequently, the space between the first n-source regions 9 and second n-source regions 10 at their surfaces can be reduced. Hence, the cells can be miniaturized. As a result, the ON voltage can be lowered.

The use of the p-type semiconductor substrate 1 described above makes it possible to place the substrate 1 at ground potential. Consequently, a CMOS circuit (not shown) or the like can be easily formed on the substrate 1. The n-type extended n-drain regions 4 formed in the bottoms of the trenches are formed in spaced relation to each other. The n-drain regions 4 also can be formed in contact with each other.

Alternatively, the configuration shown in FIGS. 2A-2C can be adopted. FIG. 2A shows the configuration in which the n-well region 2 also functions as the n-drain region 4 of FIG. 1C. FIGS. 2A and 2B show the configuration in which the semiconductor substrate is of the n type. In FIG. 2B, the semiconductor substrate 1 also functions as the n-drain regions 4 of FIG. 1C. In FIG. 2C, further n-drain regions 4 can be added to the structure of FIG. 2B. While FIG. 1C has the gate electrodes 7 formed in laterally spaced relationship within each trench 3, the embodiment of FIGS. 2A-2C can have the gate electrodes 7 integrated into one.

Figure 3:
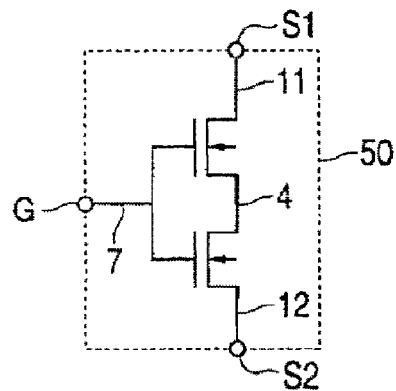
FIG. 3 schematically illustrates an equivalent circuit diagram of the bidirectional LMOSFET of FIGS. 1A-1C.

FIG. 3 is an equivalent circuit diagram of the bidirectional LMOSFET of FIG. 1. The operation of this bidirectional LDMOSFET 50 is as follows. When a higher voltage is applied to a second source terminal S2 than to a first source terminal S1, and a higher voltage is applied to a gate terminal G than to the second source terminal S2, a channel is formed in the side surface of the p-type offset region 5 surrounded by the first n-source region 9, the second n-source region 10, and the n-drain regions 4 of FIG. 1. Here, the electrical current flows from the second source terminal S2 to the first source terminal S1. When a higher voltage is applied to the first source terminal S1 than to the second source terminal S2, and a higher voltage is applied to the gate terminal G than to the first source terminal S1, a channel is formed in the side surface of the p-type offset region 5 surrounded by the first n-source region 9, the second n-source region 10, and the n-drain region 4. Here, the electrical current flows from the first source terminal S1 to the second source terminal S2. In this way, electrical currents can be made to flow in two directions. Thus, a bidirectional LMOSFET is accomplished.

On the other hand, the electrical current of the bidirectional LMOSFET can be cut off by setting the potential at the gate terminal G equal to the potential at the lower potential side of the first and second source terminals S1 and S2 or placing the gate terminal G at ground potential to annihilate the channel formed in the p-type offset region 5.

Figure 4A:
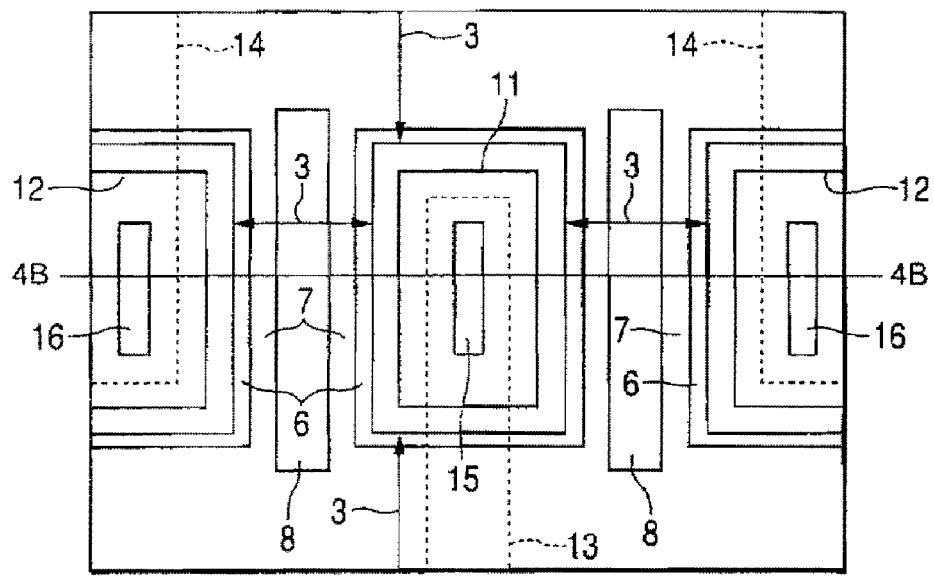
FIGS. 4A-4B schematically illustrate a second embodiment of a semiconductor device according to the present invention, where
Figure 4B:
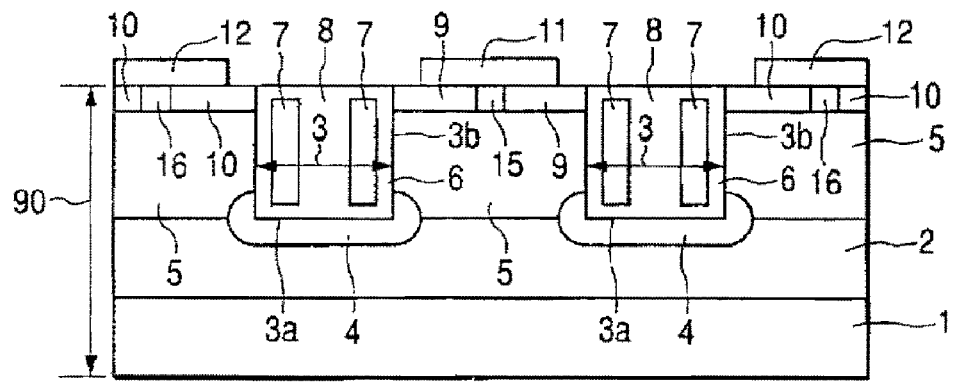

FIGS. 4A-4B schematic illustrate a second embodiment of a semiconductor device according to the present invention. The differences between the first and second embodiments are that in the second embodiment the p-contact regions 15 and 16 surrounded by first and second n-source regions 9 and 10, respectively, are formed in the surface of the p-type offset region 5, and that the p-contact regions 15 and 16 are formed over the first n-source region 9 and the second n-source region 10, respectively. The operation is the same as already described in connection with FIG. 3.

In the second embodiment, the potential at the p-type offset region 5 is stabilized by forming the p-contact regions 15 and 16. Also, the safely operating region of the bidirectional LMOSFET is widened. With respect to this bidirectional LMOSFET, parasitic diodes are incorporated by forming the p-contact regions 15 and 16. An operation mode in which the device acts as a bidirectional IGBT is also present. Therefore, even where the gate voltage (a voltage at the gate electrodes 7) is lower than the voltage at the source electrodes at the higher potential side, a main current can be made to flow between the first source electrode 11 and the second source electrode 12. The second embodiment is the same as the first embodiment in the other respects.

Figure 5A:
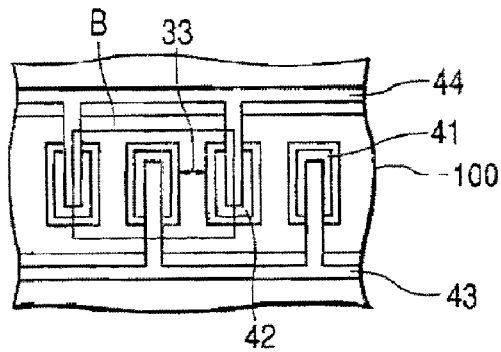
FIGS. 5A-5C schematically illustrate a third embodiment of a semiconductor device according to the present invention, where
Figure 5B:
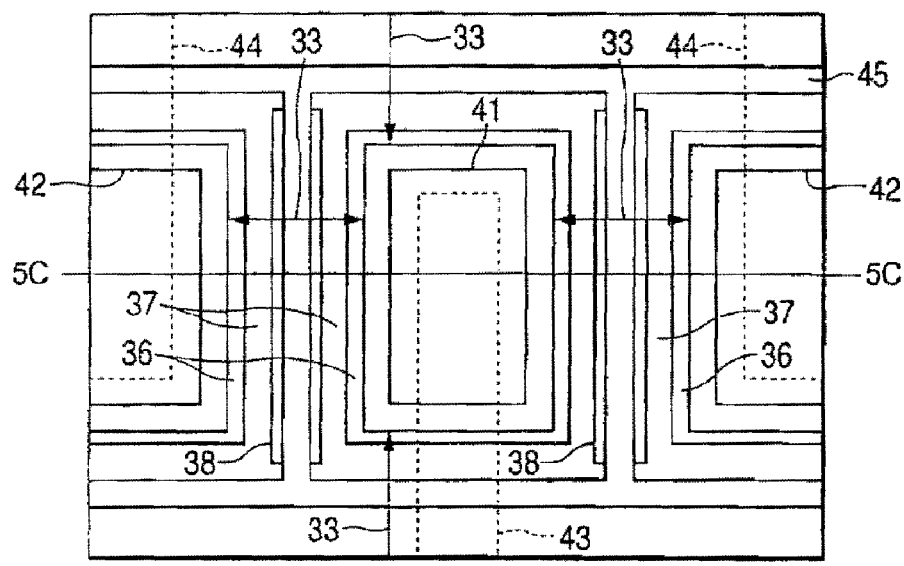
Figure 5C:
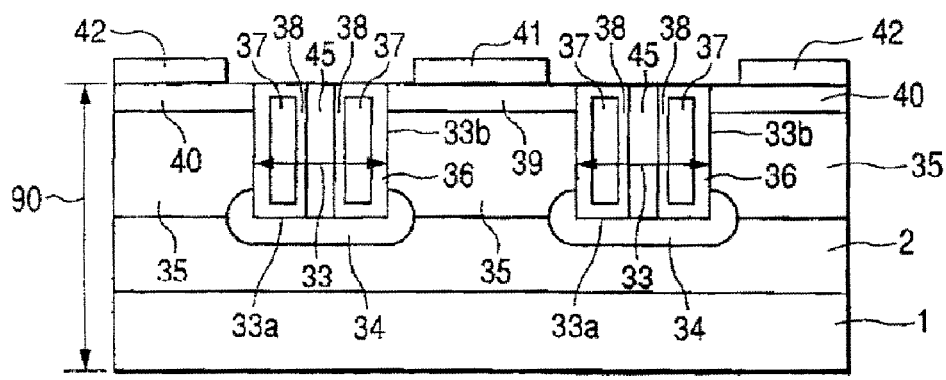

FIGS. 5A-5C schematically illustrate a third embodiment of a semiconductor device according to the present invention. In this embodiment, a bidirectional LMOSFET is taken as an example. An n-well region 2 is formed on a p-type semiconductor substrate 1. Trenches 33 are formed in the n-well region 2. Then, n-source regions 34 are formed under the bottom surfaces 33a of the trenches. A p-type offset region 35 is formed in the surface of the n-well region 2.

A gate insulator film 36 is formed on the inner wall of each trench 33. Gate electrodes 37 are formed over the sidewalls 33b of the trenches with the gate insulator film 36 formed therebetween. First n-drain regions 39 and second n-drain regions 40 are formed in the surfaces of the p-type offset region 35 surrounded by the trenches 33 such that the regions 39 and 40 are in contact with the trenches 33. The first n-drain regions 39 and the second n-drain regions 40 are formed alternately with the intervening trenches 33 therebetween. The upper sides of the gate electrodes 37 and the inside of each trench 33 are filled with an interlayer dielectric film 38, thus achieving planarization. Contact holes are formed in the interlayer dielectric film 38. First drain electrodes 41 and second drain electrodes 42 are formed on the first n-drain regions 39 and the second n-drain regions 40, respectively. The surfaces of the n-source regions 34 are exposed. Pick-up electrodes 45 are loaded. Where the n-source region is split into plural parts, the pick-up electrodes 45 act to produce an equipotential state. Furthermore, a given potential can be obtained by applying a control voltage. For example, when the device is OFF, the electrical current between drain terminals D1 and D2 can be cut off by applying ground potential. The first drain electrodes 41 are connected by a first drain interconnect 43. The second drain electrodes 42 are connected by a second drain interconnect 44. The gate electrodes 37 are connected with gate pads (not shown) via gate interconnects.

The n-source regions 34 are formed in the bottoms of the trenches and coated with the interlayer dielectric film 38. This mitigates the electric field. A high breakdown voltage of about 30 V can be secured. Furthermore, as mentioned previously, the gate electrodes 37 and the p-type offset regions 35 are formed in the trenches. Thus, high breakdown voltage is maintained along the sidewalls 33b of the trenches. Consequently, the space between the first n-drain regions 39 and the second n-drain regions 40 at their surfaces can be reduced. Hence, the cells can be miniaturized. As a result, the ON voltage can be lowered.

The use of the p-type semiconductor substrate 1 as described above makes it possible to place the substrate 1 at ground potential. Consequently, a CMOS circuit (not shown) or the like can be easily formed on the substrate 1. Although the n-source regions 34 formed in the bottoms of the trenches are formed in spaced relation to each other, they can be formed in contact with each other.

Figure 6:
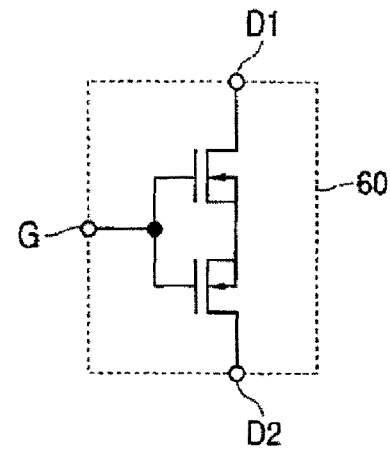
FIG. 6 schematically illustrates an equivalent circuit diagram of the bidirectional LMOSFET of FIGS. 5A-5C.

FIG. 6 is an equivalent circuit diagram of the bidirectional LMOSFET of FIGS. 5A-5C. The operation of this bidirectional LMOSFET 60 is as follows. When a higher voltage is applied to a second drain terminal D2 than to a first drain terminal D1, and a higher voltage is applied to a gate terminal G than to the first drain terminal D1, a channel is formed in the side surface of the p-type offset region 35 surrounded by the first n-drain region 39, the second n-drain region 40, and the n-source regions 34 shown in FIGS. 5A-5C. In this state, the electrical current flows from the second drain terminal D2 to the first drain terminal D1. When a higher voltage is applied to the first drain terminal D1 than to the second drain terminal D2, and a higher voltage is applied to the gate terminal G than to the second drain terminal D2, a channel is formed in the side surface of the p-type offset region 35 surrounded by the first n-drain region 39, the second n-drain region 40, and the n-source region 34. In this state, the electrical current flows from the first drain terminal D1 to the second drain terminal D2. Thus, a bidirectional LMOSFET is accomplished. The bidirectional LMOSFET can be cut off by setting the potential at the gate terminal G equal to the potential at the lower potential side of the first and second drain terminals D1 and D2 to annihilate the channel formed in the p-type offset region 35.

Figure 7A:
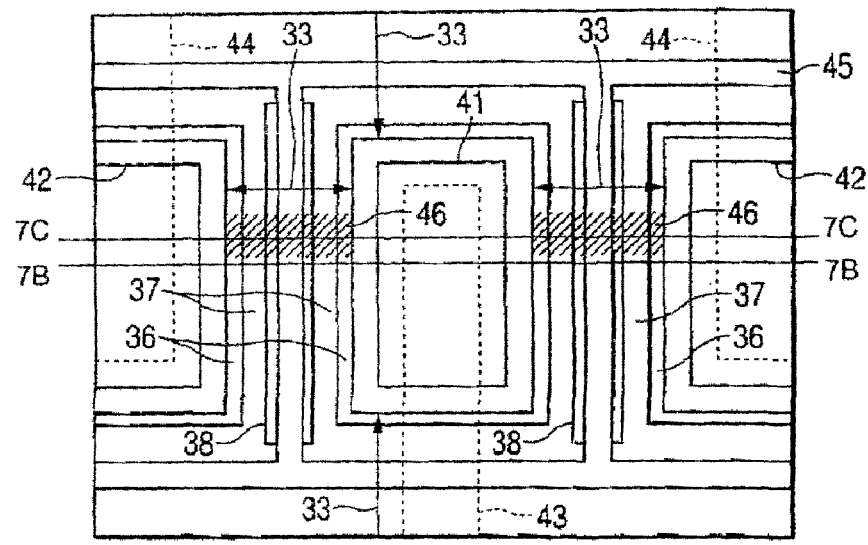
FIGS. 7A-7C schematically illustrate a fourth embodiment of a semiconductor device according to the present invention, where
Figure 7B:
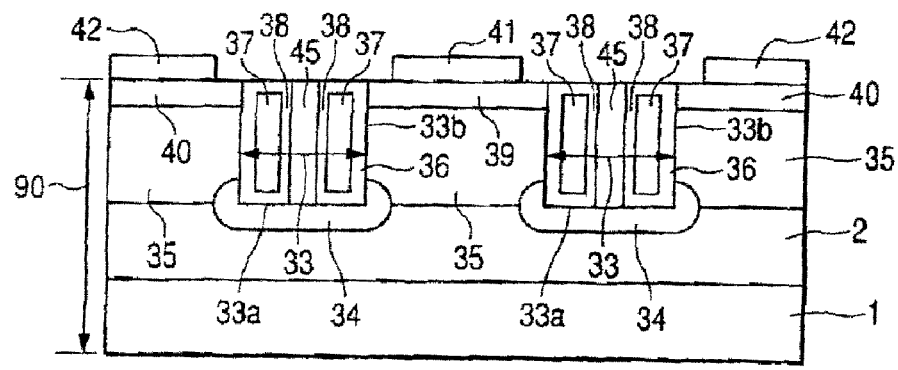
Figure 7C:
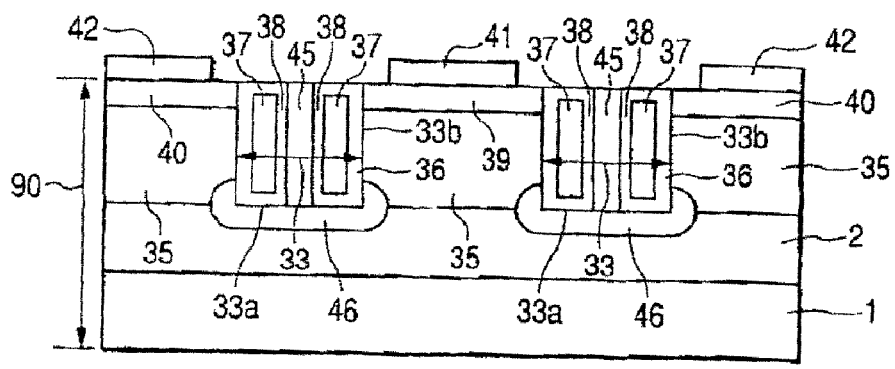

FIGS. 7A-7C schematically illustrate a fourth embodiment of a semiconductor device according to the present invention. In this embodiment, a bidirectional LMOSFET is taken as an example. The differences between the third and fourth embodiments are that in the fourth embodiment p-base pick-up regions 46 are formed adjacent to n-source regions 34 located under the bottom surfaces 33a of the trenches and that the pick-up electrodes 45 are formed in contact with the n-source regions 34 and the p-base pick-up regions 46. In this way, the p-base pick-up regions 46 are formed. The p-base pick-up regions 46 and the n-source regions 34 are shorted by the pick-up electrodes 45. This stabilizes the potential at the p-type offset regions 35 and widens the safely operating region of the bidirectional LMOSFET. The fourth embodiment is the same with the third embodiment in the other respects.

Figure 8:
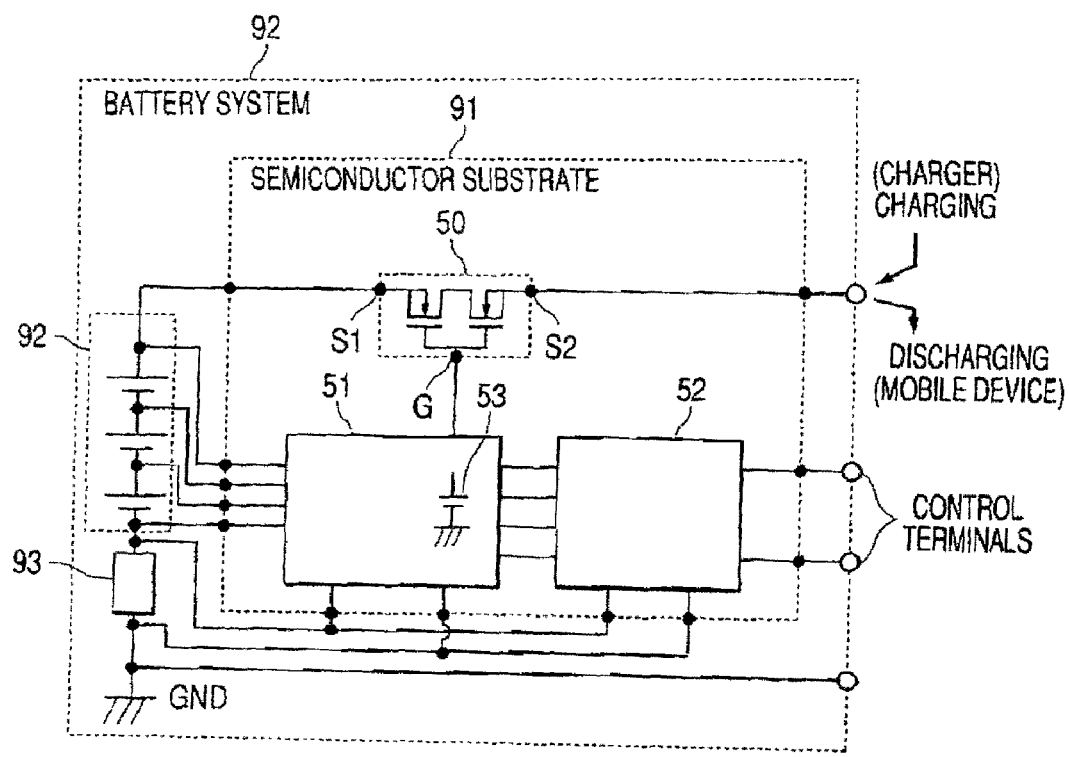
FIG. 8 schematically illustrates a layout diagram of the main portions of a fifth embodiment of a semiconductor device according to the present invention.

FIG. 8 is a layout diagram of main portions of another embodiment of a semiconductor device according to the present invention. Here, a power IC installed in a battery system is taken as an example. This power IC includes a semiconductor substrate 91 to which a bidirectional LMOSFET 50 according to the present invention, a drive-and-protect circuit portion 51, and a residual amount circuit portion 52 are formed. The drive-and-protect circuit portion 51 and residual amount circuit portion 52 detect the voltage of battery cells 92, a charging current flowing into the battery cells 92 from a charger (not shown), and a discharging current flowing out into a load (such as a mobile device) from the battery cells 92 by a resistor 93, control the bidirectional LMOSFET 50 to be in a normal state, and transmit a signal for turning OFF the bidirectional LMOSFET 50 to the LMOFET 50 in an abnormal case, such as overcharging or overdischarging. The drive-and-protect circuit portion 51 incorporates a charge pump circuit 53 and can apply a voltage higher than the voltages at the first and second source terminals S1 and S2 of the bidirectional LMOSFET 50 to the gate terminal G. A control terminal is used to specify the amount of charge remaining in the battery cells 92 from outside.

Figure 9A:
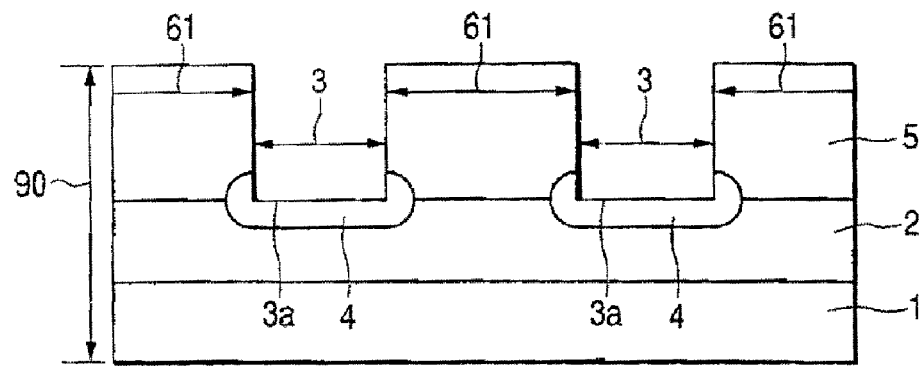
FIGS. 9A-9C illustrate cross sections of the main portions of the semiconductor device of FIGS. 1A-1C, illustrating the sequence of manufacturing the device according to the present invention.
Figure 9B:
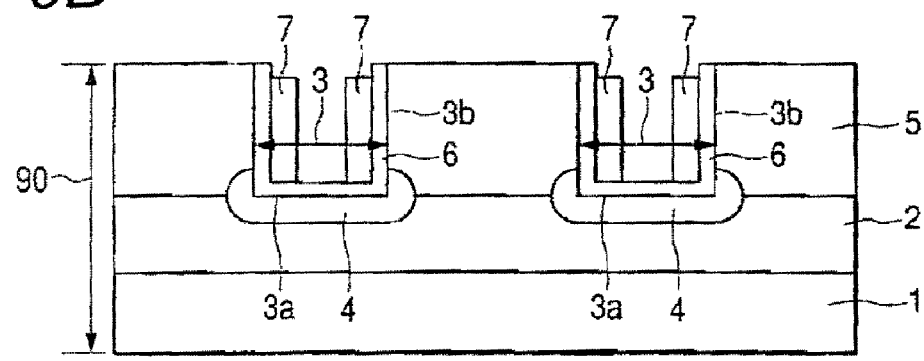
Figure 9C:
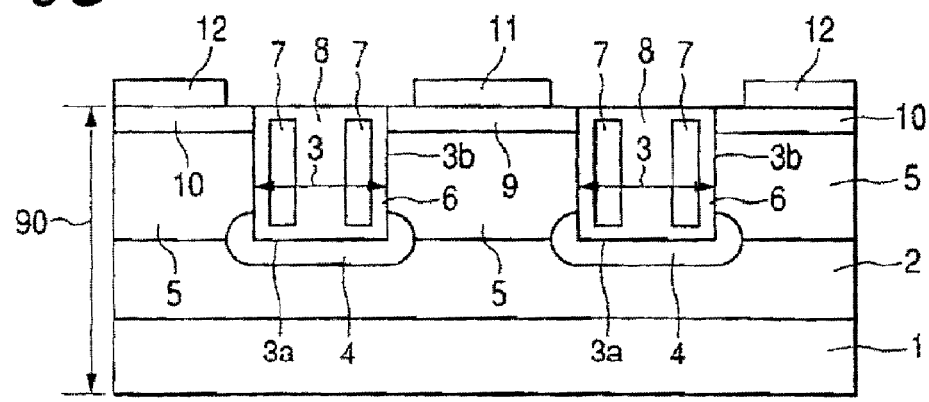

FIGS. 9A-9C schematically illustrate cross section of main portions of a semiconductor device of FIGS. 1A-1C to illustrate a sequence of method steps of fabricating or manufacturing the device according to the present invention. Here, an n-well region 2 can be formed on a p-type semiconductor substrate 1, and a p-type offset region 5 having a surface concentration of $1 \times 10^{17}$ cm$^{-3}$ and a diffusion depth of 1 μm can be formed thereafter. Using an oxide film as a mask, trenches 3 having a width of 1.5 μm are formed in the n-well region 2. Then, n-drain regions 4 having a surface concentration of $1 \times 10^{18}$ cm$^{-3}$ and a diffusion depth of 1 μm are formed in the bottom surfaces 3a of the trenches 3 from the windows of the trenches 3 by ion implantation and thermal treatment (thermal drive step). See FIG. 9A. The trenches 3 can be formed after or before forming the well region 2 and p-type offset region 5.

Referring to FIG. 9A, ions (not shown) for adjusting the threshold value can be implanted at a tilt angle of 45 degrees into a channel formation location in the sidewall 3b of each trench to form a diffusion layer having a surface concentration of $7 \times 10^{16}$ cm$^{-3}$ and a diffusion depth of 0.3 μm. Then, the channel formation location can be cleaned. Thereafter, a gate insulator film 6 (such as gate oxide film) can be formed on the inner wall of each trench. Doped polysilicon is deposited to a thickness of 0.3 μm on the gate insulator film 6 to form the gate electrodes 7, which can be formed by anisotropic etching.

Referring to FIG. 9C, a first n-source region 9 and a second n-source region 10 can be formed on the surface of the p-type offset region 5. An oxide film can be deposited as an interlayer dielectric film 8 to fill each trench therewith. The surface of the interlayer dielectric film 8 can then be planarized by etchback. Subsequently, ions can be implanted into the first and the second n-source regions 9, 10 to reduce the contact resistance. A first source electrode 11 and a second source electrode 12 can be formed thereafter, from aluminum or other material, on the first and the second n-source regions 9 and 10, respectively. Then, first and second source interconnects (not shown) can be formed.

Figure 10A:
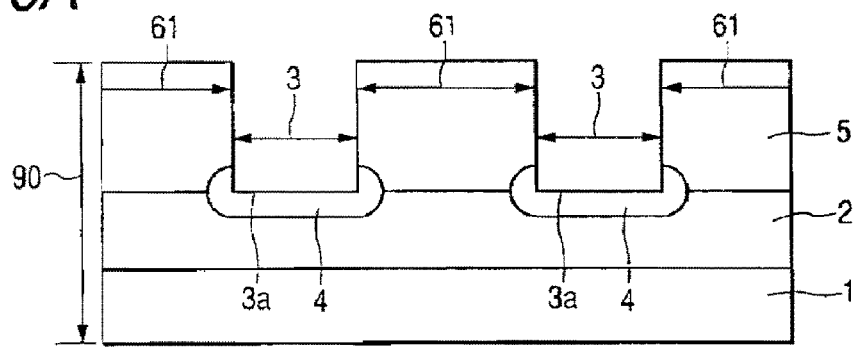
FIGS. 10A-10C schematically illustrate cross sections of the main portions of the semiconductor device of FIGS. 4A-4B, illustrating the sequence manufacturing the device according to the present invention.
Figure 10B:
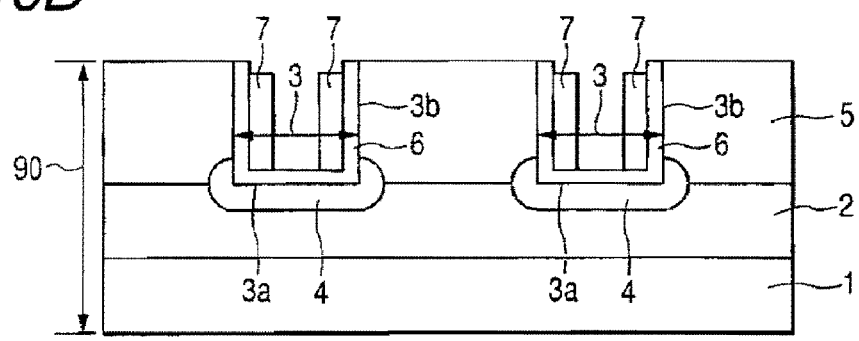
Figure 10C:
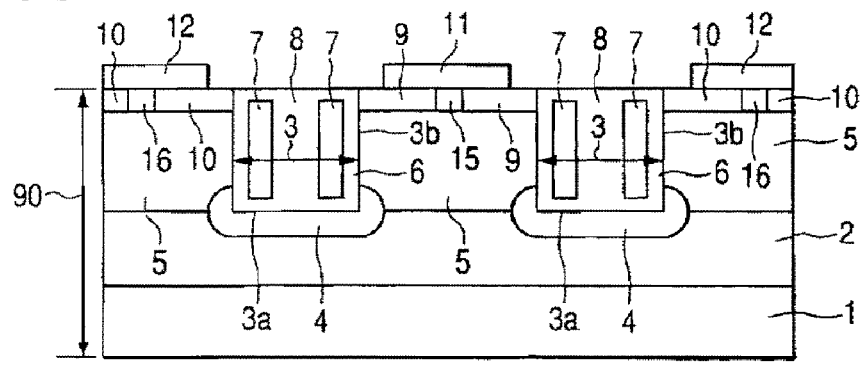

FIGS. 10A-10C schematically illustrate cross-sections of the main portions of a semiconductor device of FIGS. 4A-4B to illustrate a sequence of method steps of fabricating or manufacturing the device according to the present invention. The method here is only different from the method explained with FIGS. 9A-9C in that p-contact regions 15 and 16 are also formed (see FIG. 10C), and that the first and second source electrodes 11 and 12, respectively, are in contact with the p-contact regions 15 and 16, respectively.

Figure 11A:
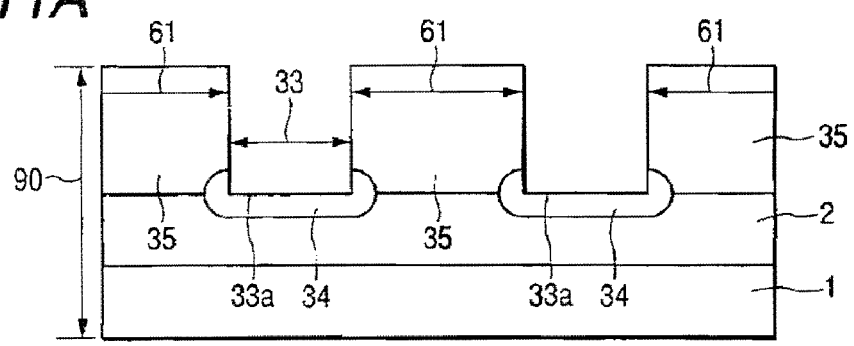
FIGS. 11A-11C schematically illustrate cross sections of the main portions of the semiconductor device of FIGS. 7A-7C, illustrating the sequence of manufacturing the device according to the present invention.
Figure 11B:
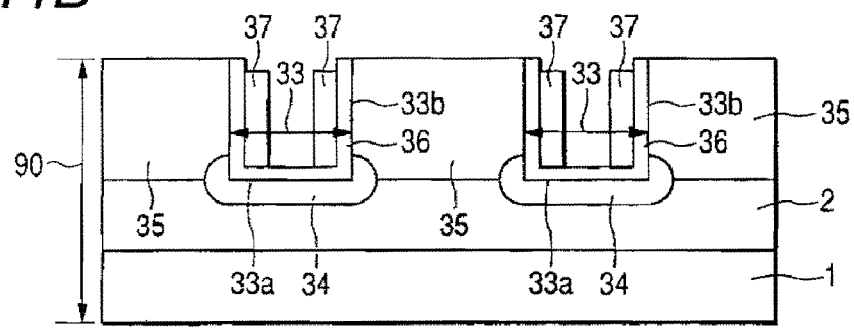
Figure 11C:
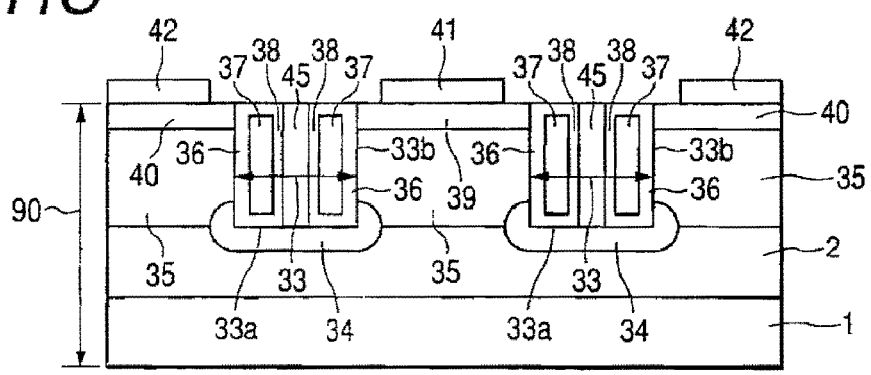

FIGS. 11A-11C schematically illustrate cross sections of the main portions of a semiconductor device of FIGS. 5A-5C to illustrate a sequence of method steps of fabricating or manufacturing the device according to the present invention. Here, an n-well region 2 can be formed on a p-type semiconductor substrate 1. Using an oxide film (not shown) as a mask, trenches 33 having a width of 3 μm can be formed in the n-well region 2. Then, n-source regions 34 having a surface concentration of $1 \times 10^{18}$ cm$^{-3}$ and a diffusion depth of 1 μm can be formed in the bottom surfaces 33a of the trenches from the windows of the trenches 33 by ion implantation and thermal treatment (thermal drive step). Then, the mask of oxide film is removed. Subsequently, p-type offset regions 35 having a surface concentration of $1 \times 10^{17}$ cm$^{-3}$ and a diffusion depth of 1 μm can be formed in the portions of the semiconductor regions 61 split by the trenches 33 such that the offset regions 35 are in contact with the n-drain regions 34. See FIG. 11A.

Referring to FIG. 11B, ions (not shown) for adjusting the threshold value can be implanted at a tilt angle of 45 degrees into a channel formation location in the sidewall 33b of each trench to form a diffusion layer having a surface concentration of $7 \times 10^{16}$ cm$^{-3}$ and a diffusion depth of 0.3 μm. Then, the channel formation location can be cleaned. Thereafter, a gate insulator film 36 can be formed on the inner wall of each trench. Doped polysilicon can be deposited to a thickness of 0.3 μm on the gate insulator film 36 to form gate electrodes 37, which can be formed by anisotropic etching.

Referring to FIG. 11C, a first n-drain region 39 and a second n-drain region 40 can be formed on the surface of each p-type offset region 35. An oxide film can be deposited as an interlayer dielectric film 38. The wide inside of each trench, however, is not filled with the interlayer dielectric film 38 by this step. The interlayer dielectric film 38 in the bottoms of the trenches 33 can be etched away by etchback to expose the surfaces of the n-source regions 34. Subsequently, a barrier metal (not shown) can be deposited onto the bottom surface of each trench 33. Specifically, pick-up electrodes 45 made of tungsten can be buried, and planarized. Then, ions can be implanted into the first and second drain regions 39, 40 to reduce the contact resistance. First and second drain electrodes 41 and 42, respectively, then can be formed from aluminum on the first and second n-drain regions 39, 40. At the same time, an aluminum film can be formed on the pick-up electrodes 45. Subsequently, first and second drain interconnects (not shown) can be formed.

FIGS. 12A-12C schematically illustrate cross sections of the main portions of a semiconductor device according to FIGS. 7A-7C to illustrate a sequence of method steps of fabricating the device according to the present invention. The differences with the method sequence illustrated in FIGS. 11A-11C are that p-base pick-up regions 46 are formed in the bottoms of the trenches in FIG. 12A and that pick-up electrodes 45 and the p-base pick-up regions 46 are in contact with each other in FIG. 12C.

Figure 13A:
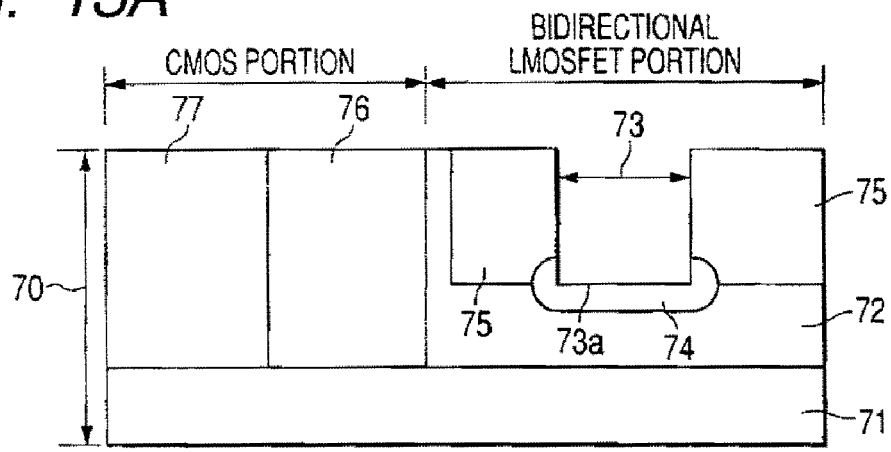
FIGS. 13A-13C schematically illustrate cross sections of the main portions of another embodiment of a semiconductor device according to the present invention, illustrating the sequence of fabricating the device according to the present invention.
Figure 13B:
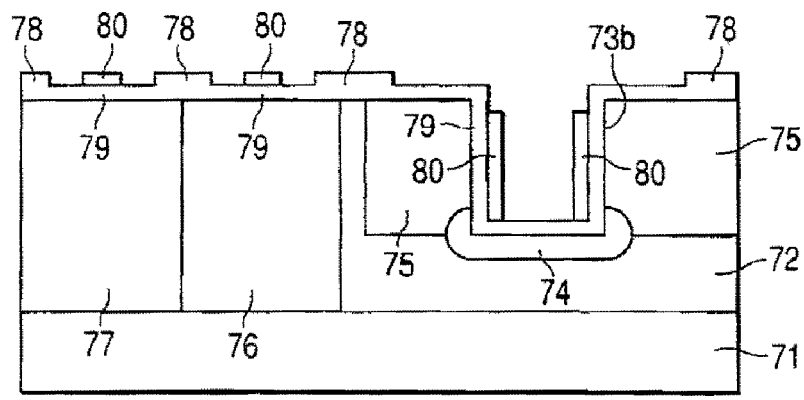
Figure 13C:
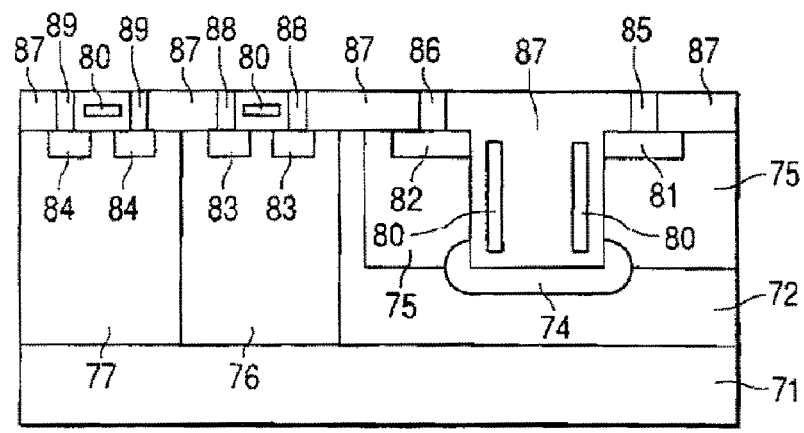
Figure 14:
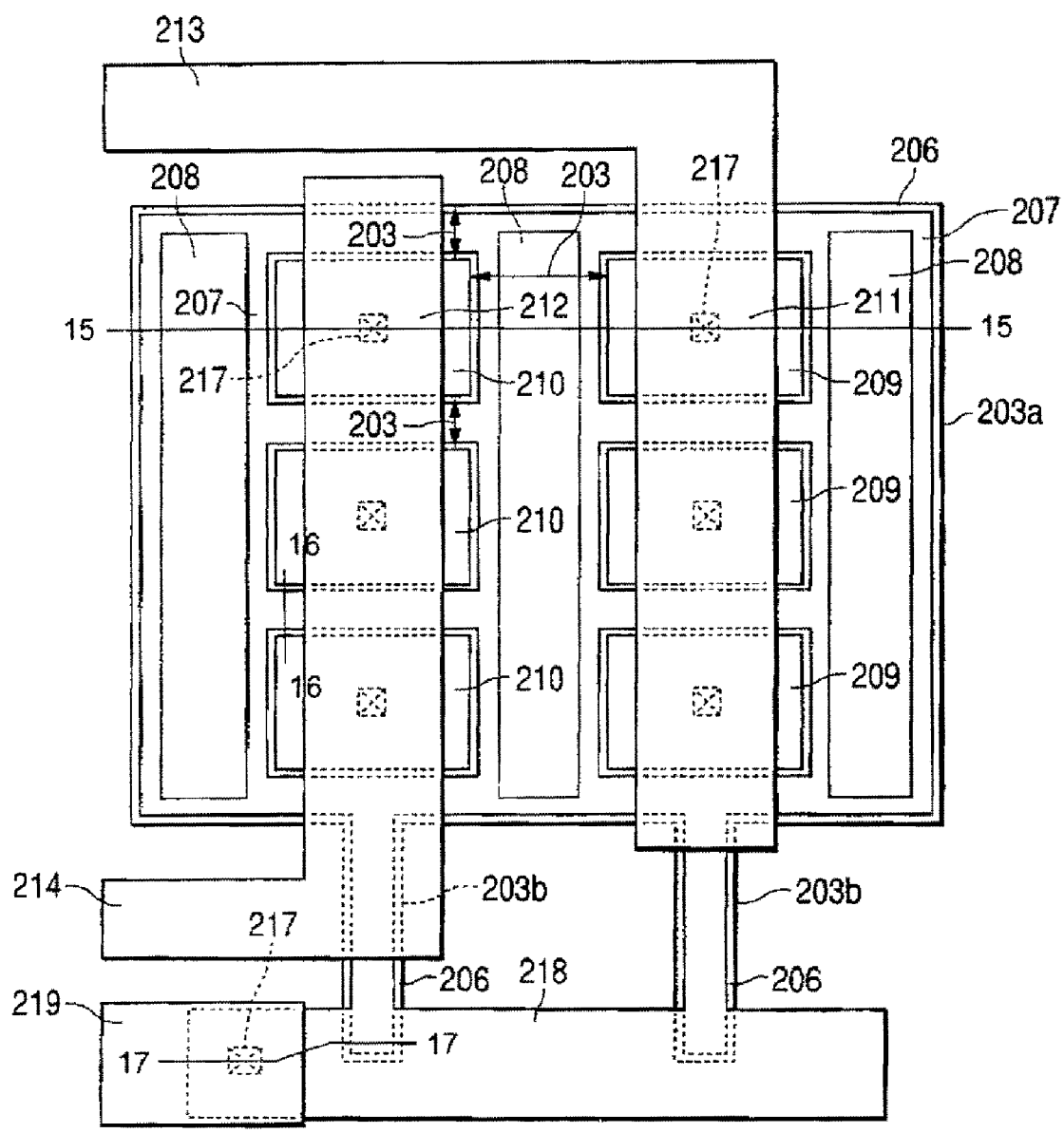
FIG. 14 schematically illustrates a plan view of the main portions of another embodiment of a semiconductor device according to the present invention.
Figure 15:
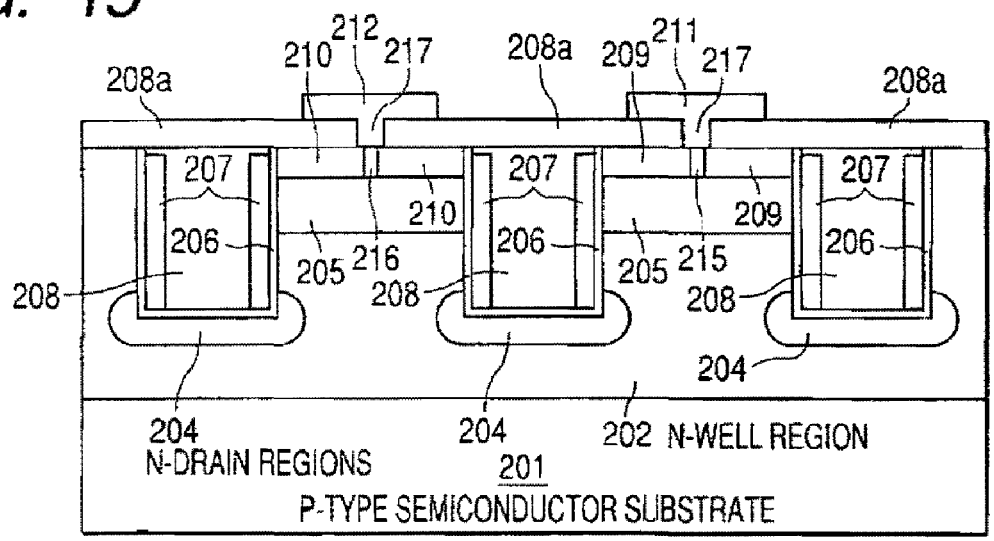
FIG. 15 schematically illustrates a cross section taken along line 15-15 of FIG. 14.
Figure 16:
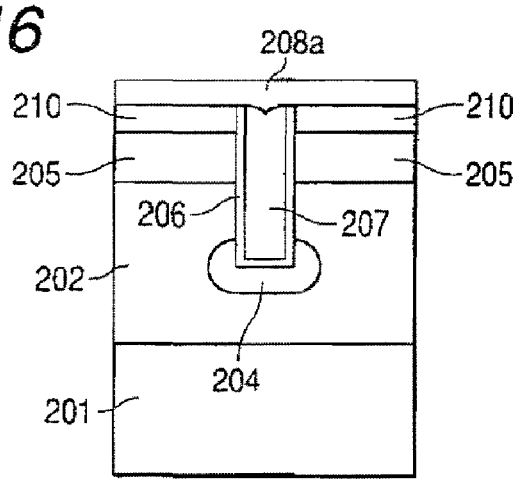
FIG. 16 schematically illustrates a cross section taken along line 16-16 of FIG. 14.
Figure 17:
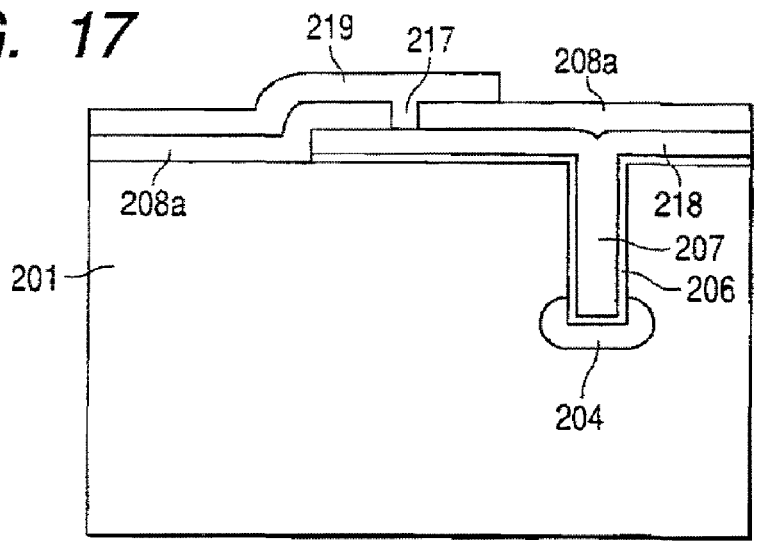
FIG. 17 schematically illustrates a cross section taken along line 17-17 of FIG. 14.

FIGS. 13A-13C schematically illustrate cross-sections of the main portions of FIGS. 1A-1C and CMOSes formed on the same semiconductor substrate to illustrate a method of fabricating a semiconductor device according to the present invention. The CMOSes are fundamental devices for forming the drive-and-protect circuit and residual amount circuit of FIGS. 7A-7C.

Referring to FIG. 13A, an n-well region 72 can be formed on a p-type semiconductor substrate 71. Using an oxide film (not shown) as a mask, trenches 73 having a width of 1.5 μm can be formed in the n-well region 72. P-well regions 76 also can be formed. Then, n-drain regions 74 having a surface concentration of $1 \times 10^{17}$ cm$^{-3}$ and a diffusion depth of 1 μm can be formed in the bottom surfaces 73a of the trenches 73 from the windows of the trenches 73 by ion implantation and thermal treatment (thermal drive step). Then, the mask of oxide film can be removed, and p-type offset regions 75 having a surface concentration of $1 \times 10^{17}$ cm$^{-3}$ and a diffusion depth of 1 μm can be formed.

Referring to FIG. 13B, device isolation on the surface can be provided by a LOCOS technique. Then, ions (not shown) for adjusting the threshold value can be implanted at a tilt angle of 45 degrees into channel formation locations in the CMOS portion and in the trench sidewalls 73b to form a diffusion layer having a surface concentration of $7 \times 10^{16}$ cm$^{-3}$ and a diffusion depth of 0.3 μm. Then, the channel formation locations can be cleaned. A gate insulator film 79 can be formed on the inner wall of each trench. Doped polysilicon is deposited to a thickness of 0.3 μm on the gate insulator film 79 to form gate electrodes 80, which can be formed in the CMOS portion and in the trenches by anisotropic etching.

Referring to FIG. 13C, a first n-source region 81 and a second n-source region 82 can be formed on the surface of each p-type offset region 75. Source/drain regions 83 and 84 can be formed in the CMOS portion. An oxide film can be deposited as an interlayer dielectric film 87 to fill each trench therewith. Subsequently, the surface of the interlayer dielectric film 87 can be planarized by etchback. Contact holes can be formed in the interlayer dielectric film 87. Plug ions can be implanted into the openings to reduce the contact resistance. First and second source electrodes 85 and 86, respectively, can be formed from aluminum on the first and second n-source regions 81 and 82, respectively. Source/drain electrodes 88 and 89 can be formed on the source/drain regions 83 and 84, respectively, of the CMOS portion.

A semiconductor device of another embodiment of the invention that is different from the semiconductor device of the invention described thus far and includes even a gate interconnect structure will now be described. Gate interconnects and source electrodes can be fabricated from metal film at the same time. What are placed immediately over source regions and connected via contact holes are herein taken as source electrodes, whereas the other locations are taken as gate interconnects.

FIGS. 14 to 17 schematically illustrate main portions including the gate interconnect structure according to a semiconductor device according to the present invention. The hidden portions are indicated by the dotted lines. An interlayer dielectric film 208a is omitted in FIG. 14.

Only the differences between the embodiments of FIGS. 1A-1C and FIGS. 14-17 will be described. In FIGS. 1A-1C, a single first n-source region 9 and a single second n-source region 10 are alternately arranged. In the present embodiment, plural first n-source regions 209 are formed adjacently and plural second n-source regions 210 are formed adjacently. Moreover, the p-type offset regions 205 are not in contact with the n-drain regions 204. In the same way as in FIGS. 4A and 4B, p-contact regions 215 and 216 are formed in each source region. The gate interconnect structure is shown here, although not shown in FIGS. 1A-1C.

Where the p-type offset regions 205 are not in contact with the n-drain regions 204, the breakdown voltage can be made higher than in the case where the regions 205 are in contact with the regions 204. The ON resistance can be lowered. However, higher accuracy is required during manufacturing because the width of the p-type offset (the width of the space between the n-well region 202 and source region 209) is small.

As shown in FIGS. 14 to 17, a first source electrode 211 and a first source interconnect 213 connected with the first source electrode 211 can be formed simultaneously from a metal film. The first source electrode 211 is connected with the first n-source regions 209 via contact holes 217 formed in an interlayer dielectric film 208a. Similarly, second source electrodes 212 and a second source interconnect 214 connected with the second source electrodes 212 can be formed from a metal film at the same time. The second source electrodes 212 are connected with the second n-source regions 210 via contact holes 217 formed in the interlayer dielectric film 208a. The spaces between the adjacent first n-source regions 209 and between the second n-source regions 210 are filled with gate electrodes 207 formed with a gate insulator film 206 interposed therebetween. The first n-source regions 209 and the second n-source regions 210 are located opposite each other with the interlayer dielectric film 208 interposed between them. The current capacity can be increased by enlarging the outer periphery 203a of each trench and arranging the first n-source regions 209 and the second n-source regions 210 in large quantities alternately.

Polysilicon forming the gate electrode 207 forms elongated trenches 203b protruding like capes from the outer periphery 203a of each trench in which the n-source regions 209 and 210 are formed. A polysilicon interconnect 218 is formed via the gate insulator film 206 formed on the inner wall of each trench 203b. The polysilicon interconnect 218 is also formed on the gate insulator film 206 formed on a p-type semiconductor substrate 201. The polysilicon interconnect 218 and a gate interconnect 219 of a metal film are connected via contact holes 217 formed in the interlayer dielectric film 208a.

In this way, in the semiconductor device according to the invention, all portions of the gate electrode 207 can be connected by the polysilicon (gate electrode 207) deposited on the entire region of the sidewalls of the outer peripheries 203a of the trenches so that the gate electrode 207 is singular. A semiconductor device that uses only one gate electrode in this way and to which the present invention is applied is shown in FIG. 8.

Figure 18A:
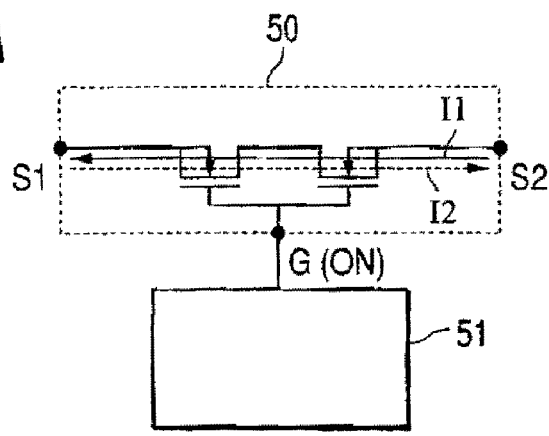
FIGS. 18A-18C schematically illustrate diagrams of the bidirectional LMOSFET and drive-and-protect circuit portion of FIG. 8, showing the conditions of the circuit during when battery cells are overcharging.
Figure 18B:
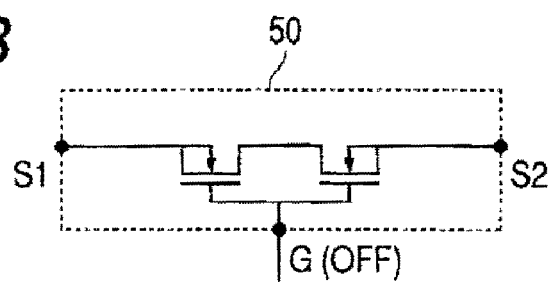
Figure 18C:
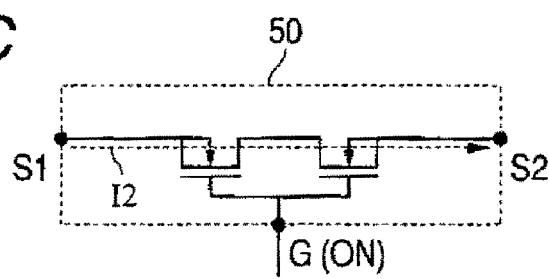

FIGS. 18A-18C schematically illustrate the bidirectional LMOSFET and drive-and-protect circuit portion of FIG. 8. These figures illustrate the conditions of the circuits during when battery cells are overcharging.

In FIG. 18A, when a mobile device (not shown), i.e., a load, is connected with the battery cells 92 of FIG. 8 and being charged, an ON signal is applied to the gate terminal G to turn ON right and left n-channel MOSFETs. A charging current I1 flows into the battery cells 92 from right to left via the bidirectional LMOSFET 50. At this time, a discharging current I2 is supplied to the load from the battery cells 92. That is, cells 92 are being discharged while being charged.

In FIG. 18B, when the battery cells 92 are overcharged, an OFF signal is applied to the gate terminal G to turn OFF the right and left n-channel MOSFETs. Under this condition, the load and battery cells 92 are isolated in terms of electric circuit. The charging current I1 no longer flows into the battery cells 92 to stop overcharging. At the same time, the discharging current I2 is not supplied from the battery cells 92 into the load. During this overcharging period, if the plug of the battery charger of FIG. 8 is removed, no current is supplied to the load at all. Consequently, the load is made inoperative.

To avoid this, as shown in FIG. 18C, an ON signal is again supplied to the gate terminal G to turn on the bidirectional LMOSFET 50, thus supplying the discharging current I2 from the battery cells 92 to the load. However, since an ON signal is delivered from the drive-and-protect circuit 51 after detecting that the voltage of the battery cells 92 has reached a normal voltage, a time delay occurs. During this time, no current is supplied from the battery cells 92 to the load. That is, an instantaneous break takes place.

Figure 19:
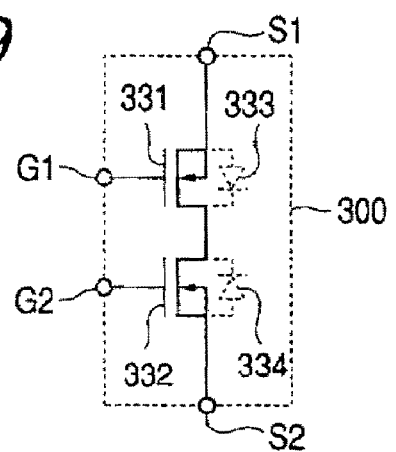
FIG. 19 schematically illustrates an equivalent circuit diagram of a bidirectional LMOSFET having two gate electrodes.

To solve this problem, a bidirectional LMOSFET in which each of the right and left n-channel MOSFETs is provided with a gate electrode can be used. FIG. 19 schematically illustrates an equivalent circuit diagram of the bidirectional LMOSFET having the two gate electrodes. This circuit is similar to FIG. 6. The differences with the configuration of FIG. 6 are as follows. The embodiment of FIG. 19 has two separate gate electrodes, each with a first gate terminal G1 or a second gate terminal G2. Their respective n-channel MOSFETs 331 and 332 can be operated separately. Parasitic diodes 333 and 334 in the n-channel MOSFETs are used for operation. An operation mode using the bidirectional LMOS-FET 300 having the two gate electrodes follows next.

Figure 20A:
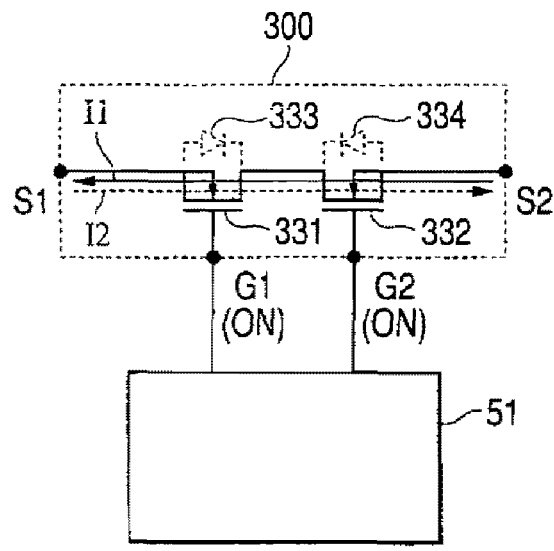
FIGS. 20A-20C schematically illustrate diagrams corresponding to FIGS. 18A-18C, where a bidirectional LMOSFET having two gate electrodes is used, and illustrating the conditions of the circuit during when battery cells are overcharging.
Figure 20B:
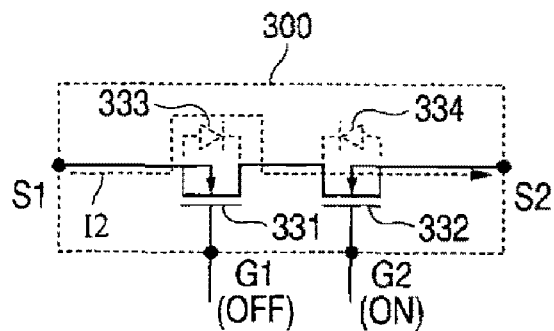
Figure 20C:
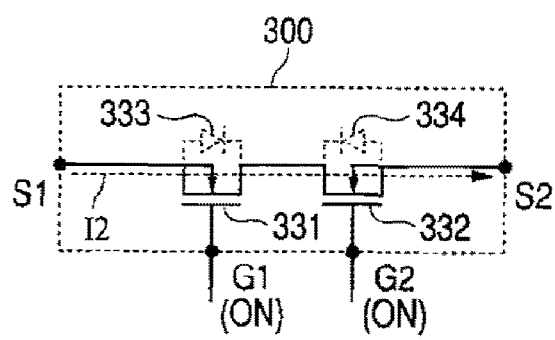

FIGS. 20A-20C schematically illustrate the circuit corresponding to FIGS. 18A-18C, showing the conditions of the circuit during when battery cells are overcharging. In FIG. 20A, an ON signal is supplied to the first and second gate terminals G1, G2 from the drive-and-protect circuit 51 to turn ON the right and left n-channel MOSFETs 331 and 332. The charging current I1 flows into the battery cells 92. At this time, the discharging current I2 is being supplied from the battery cells 92 to the load. That is, the cells 92 are being discharged while being charged.

In FIG. 20B, when the battery cells 92 are overcharged, an OFF signal is supplied to the first gate terminal G1 to cut off the charging current I1. At this time, the ON signal is kept supplied to the second gate terminal G2. As such, if the charging current I1 is cut off, the discharging current I2 flows into the load through the parasitic diodes 333 and n-channel MOSFET 332. Hence, the aforementioned instantaneous break does not take place.

In FIG. 20C, when the battery cells 92 return to the normal voltage, an ON signal is again supplied to the first gate terminal G1 to turn ON the left n-channel MOSFET 331. Under this state, the discharging current I2 is supplied to the load via the right and left n-channel MOSFETs 331, 332. Thus, normal operation is resumed. The electrical current to the load is supplied without interruption by using the bidirectional LMOSFET 300 having the two gate electrodes in this way.

Figure 21:
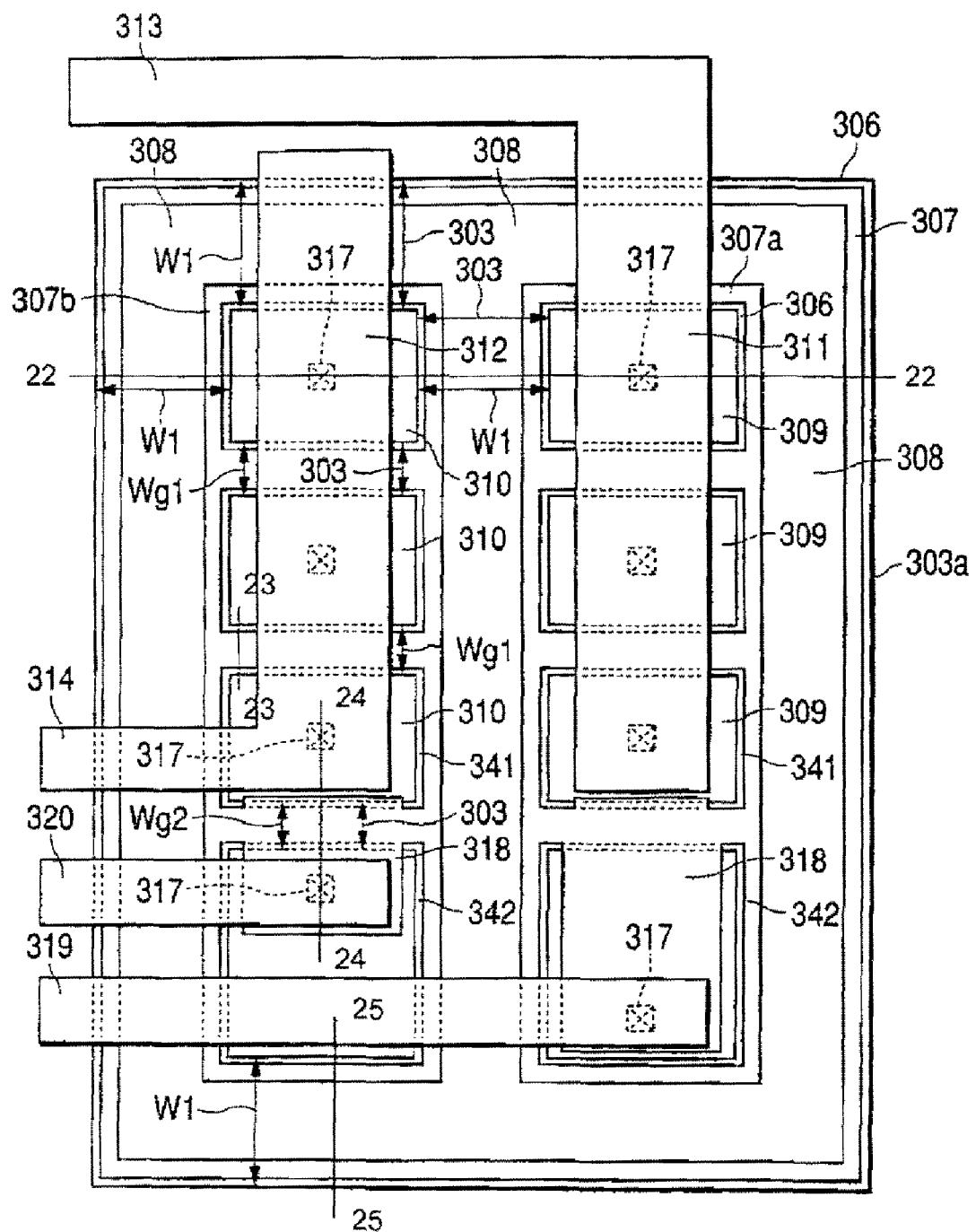
FIG. 21 schematically illustrates a plan view of the main portions of another embodiment of a semiconductor device according to the present invention.

The configuration of a semiconductor device having two gate electrodes follows next. FIGS. 21-25 schematically illustrate cross sections of the main portions of another embodiment of a semiconductor device according to the present invention. The hidden portions are indicated by the dotted lines. In FIG. 21, the interlayer dielectric film 308a is omitted. There are plural islands 341 and 342 within each trench, the islands being pillar-like remaining portions of the trench. In this diagram, there are 6 islands (device cells) 341 acting as MOSFETs. Regions 309 and 310 are formed on the islands 341. There are two islands 342 forming gate interconnects. In each island 341, a p-type offset region 305, n-source regions 309, 310, and source electrodes 311, 312 are formed.

The differences with the configuration of FIGS. 14-17 are as follows. First gate electrode 307a and second gate electrode 307b each having a gate electrode surrounded by the interlayer dielectric film 308 are independent of each other. The gate electrodes 307a and 307b are isolated from polysilicon 307 on the sidewalls of the outer peripheries 303a of the trenches. Their gate electrodes 307a and 307b are connected with first gate interconnect 319 and second gate interconnect 320 of a metal via polysilicon interconnects 318.

The polysilicon 307 deposited on the outer periphery 303a of each trench is isolated from the first gate electrode 307a and the second gate electrode 307b by the interlayer dielectric film 308 in this way. Therefore, the space W1 between the island 341 forming the first n-source region 309 and the island 341 forming the second n-source region 310 is set large enough that the space is not plugged up by the polysilicon for forming the gate electrodes. On the other hand, the space Wg1 between the islands 341 forming the first and second n-source regions 309 and 310, respectively, is set small enough that the space is completely plugged up by the polysilicon forming the gate electrodes. The space Wg2 between the island 342 forming the polysilicon interconnects 318 for connecting the gate electrodes 307a and 307b with the metal gate interconnects 319 and 320 and the island 341 forming the n-source regions 309 and 310 is set equal to the space Wg1 such that the space Wg2 is plugged up by the polysilicon.

For example, where the thickness of the polysilicon forming the gate electrodes is set to 0.3 μm, the space W1 is set approximately equal to 1 μm. The spaces Wg1 and Wg2 are set approximately equal to 0.5 μm. To planarize the surface, it is desired to set the space W1 equal to or less than the width of the island 341 forming the source region.

The advantages already described in connection with FIGS. 20A-20C are obtained by forming the independent first gate electrode 307a and second gate electrode 307b in this way.

Figure 22:
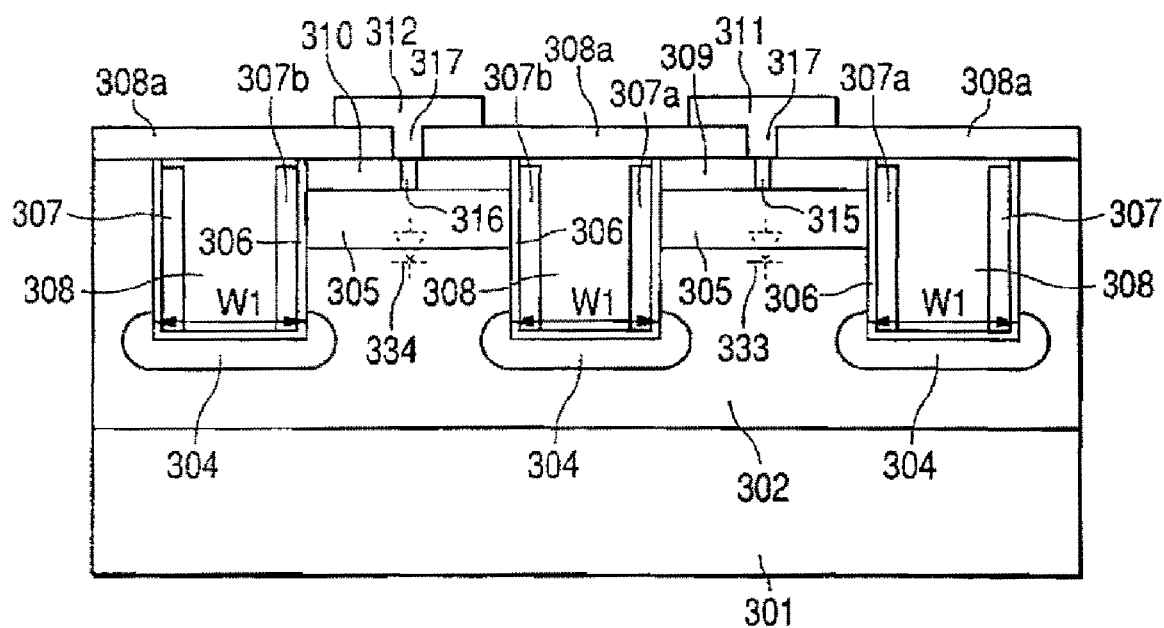
FIG. 22 schematically illustrates a cross section taken along line 22-22 of FIG. 21.
Figure 23:
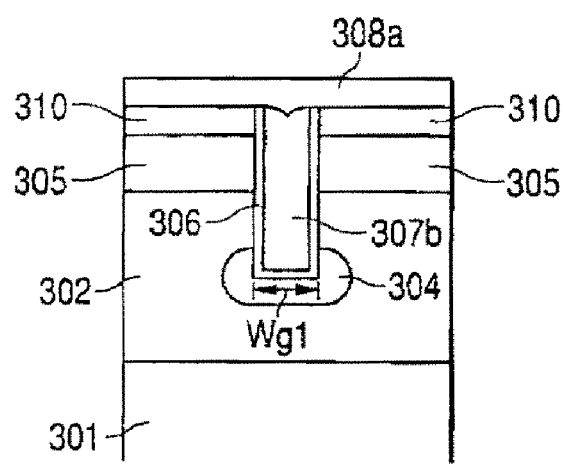
FIG. 23 schematically illustrates a cross section taken along line 23-23 of FIG. 21.
Figure 24:
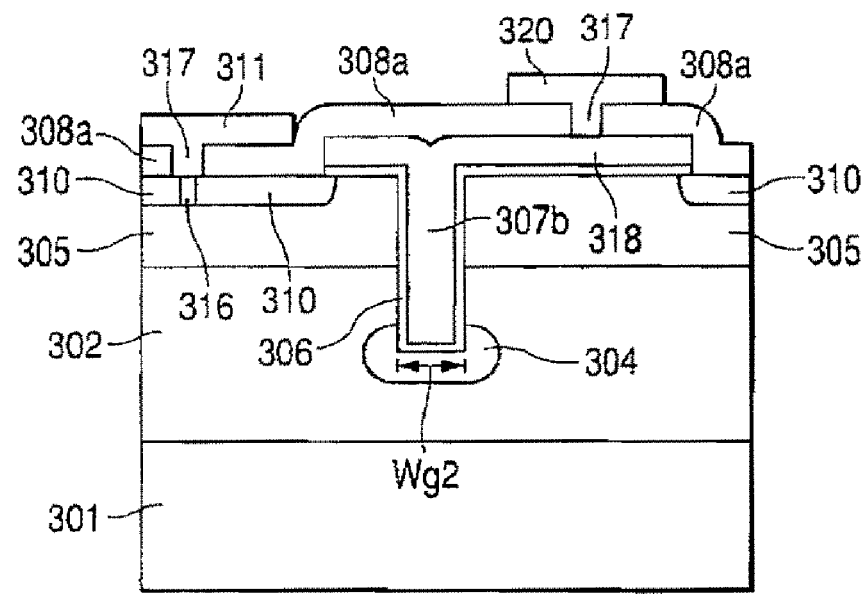
FIG. 24 schematically illustrates a cross section taken along line 24-24 of FIG. 21.
Figure 25:
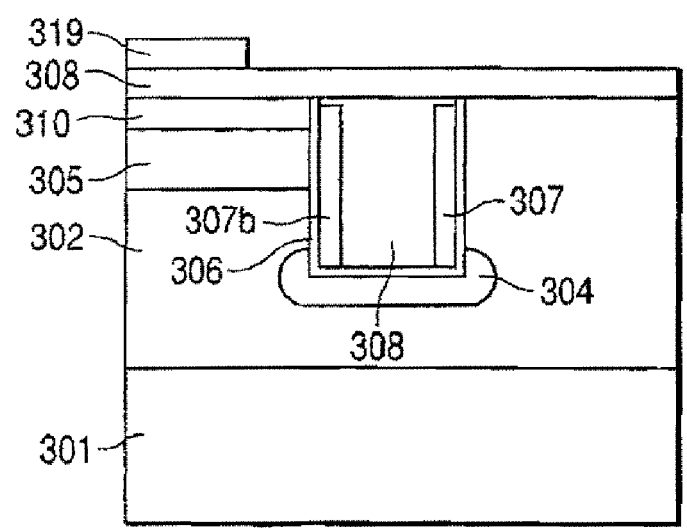
FIG. 25 schematically illustrates a cross section taken along line 25-25 of FIG. 21.

FIGS. 26A-29C schematically illustrate cross sections of the main portions of a semiconductor device of FIGS. 22-24 to illustrate the sequence of method steps of fabricating the device according to the present invention. FIGS. 26A, 27A, 28A, and 29A are cross-sectional views of portions corresponding to FIG. 22. FIGS. 26B, 27B, 28B, and 29B are cross-sectional views of portions corresponding to FIG. 23. FIGS. 26C, 27C, 28C, and 29C are cross-sectional views of portions corresponding to FIG. 24.

Figure 26A:
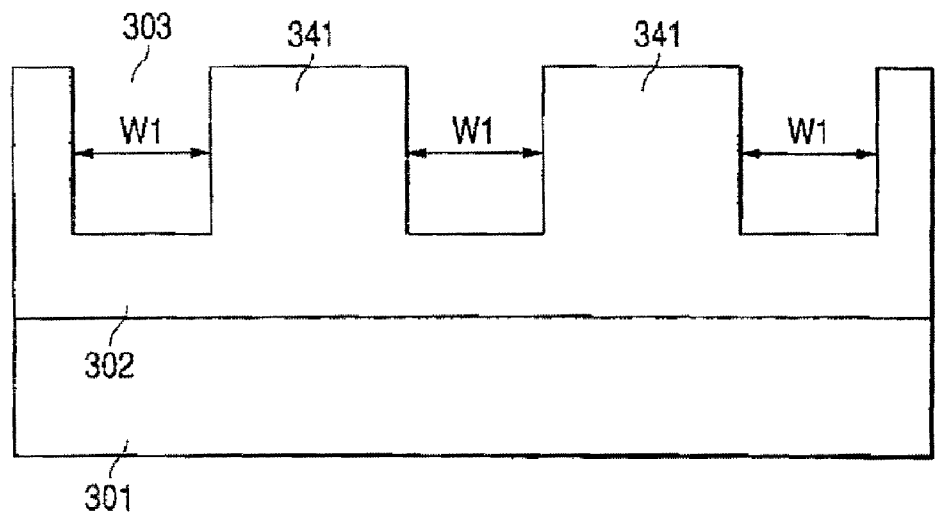
FIGS. 26A-26C schematically illustrate cross sections of the main portions of the semiconductor device of FIG. 21, illustrating the sequence of fabricating the device according to the present invention, where
Figure 26B:
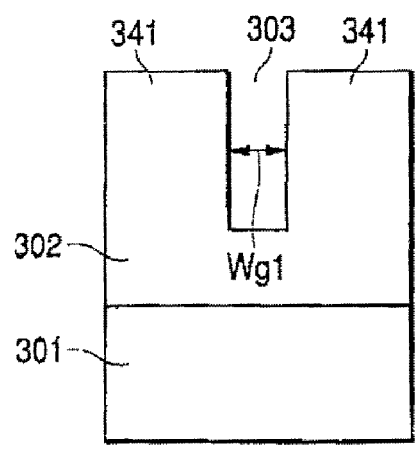
Figure 26C:
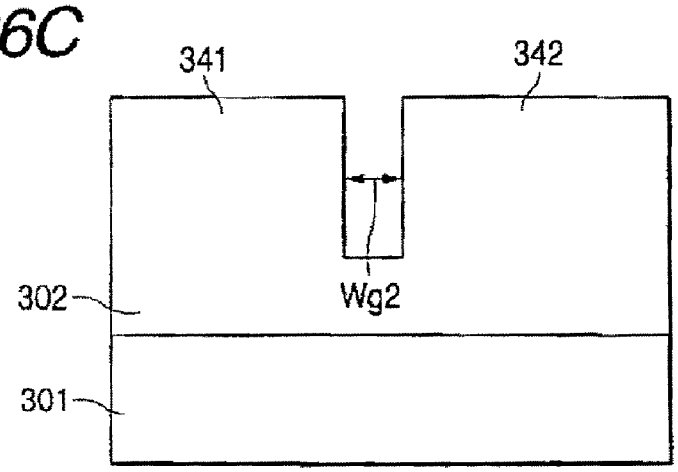

In FIGS. 26A-26C, an n-well region 302 having a surface concentration of $5 \times 10^{16}$ cm$^{-3}$ and a depth of about 4 μm, for example, can be formed on the surface of a p-type semiconductor substrate 301. Trenches 303 reaching into the n-well region 302 can be formed from the surface to a depth of about 2 μm like meshes. Pillar-like islands (remaining trench portions) 341 and 342 can be formed. The islands 341 can form first and second p-type offset regions and first and second n-source regions in a later process step. The islands 342 can form polysilicon interconnects 318 that connect the first and second gate electrodes and the first and second gate interconnects in a later process step.

The space Wg1 between the islands 341 and the space Wg2 between the islands 341 and 342 can be equally set to about 0.5 μm. As a result, the polysilicon is not separated by etchback (patterning of the polysilicon) of the polysilicon. The spaces are plugged up with the polysilicon. The space W1 of the islands 341 and 342 to the sidewalls of the outer peripheries 303a of the trenches and the space W1 between the islands 341 forming the first and second source regions 309, 310 can be set equal to or greater than 1 μm. Thus, the polysilicon can be completely separated by etchback of the polysilicon.

Figure 27A:
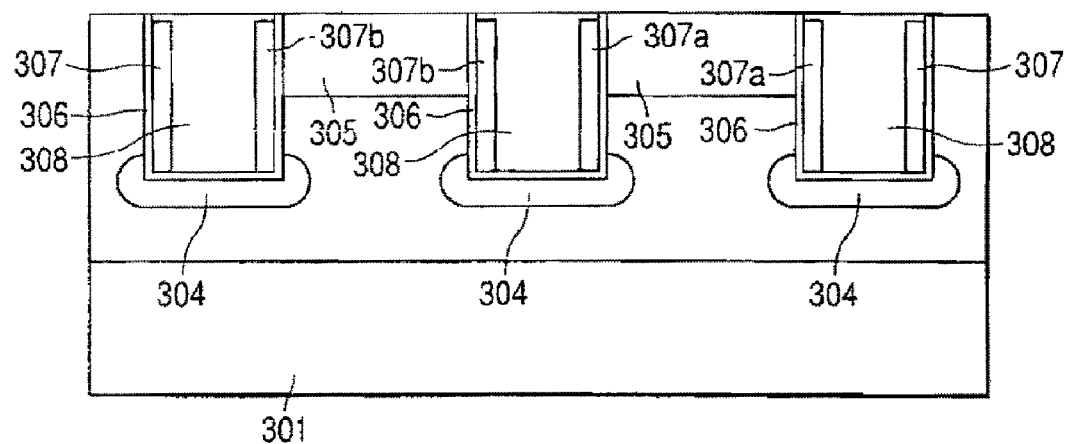
FIGS. 27A-27C schematically illustrate cross sections illustrating continuations of the sequence of FIGS. 26A-26C, where
Figure 27B:
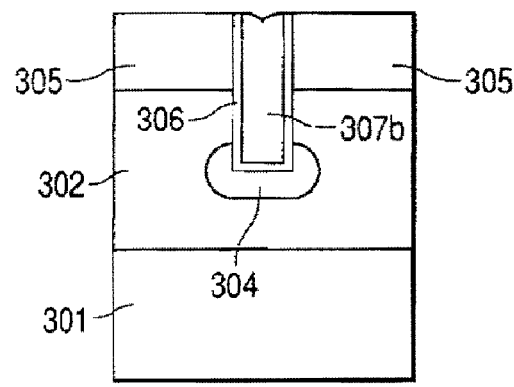
Figure 27C:
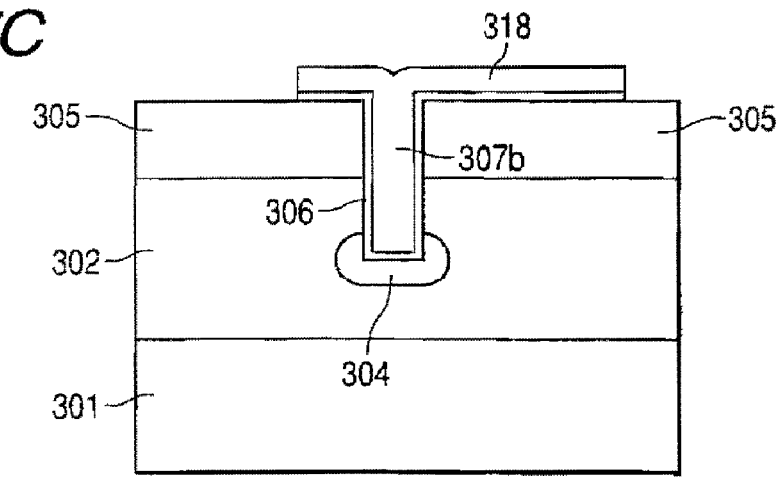

In FIGS. 27A-27C, a gate insulator film 306 is formed. N-drain regions 304 having a high concentration of more than $1 \times 10^{17}$ cm$^{-3}$ or more are formed in the n-well region 302 in the bottoms of the trenches to give a breakdown voltage of about 30 V to 50 V. A p-type offset region 305 can be formed remotely from the n-drain regions 304. In some cases, the offset region 305 can be connected. Then, polysilicon, which forms first, second gate electrodes 307a, 307b, and polysilicon interconnect 318, is deposited to a thickness of about 0.3 μm over the entire surface. The spaces between the islands 341 and the spaces between the islands 341 and 342 are completely plugged up with the polysilicon. Then, patterning is done.

Figure 28A:
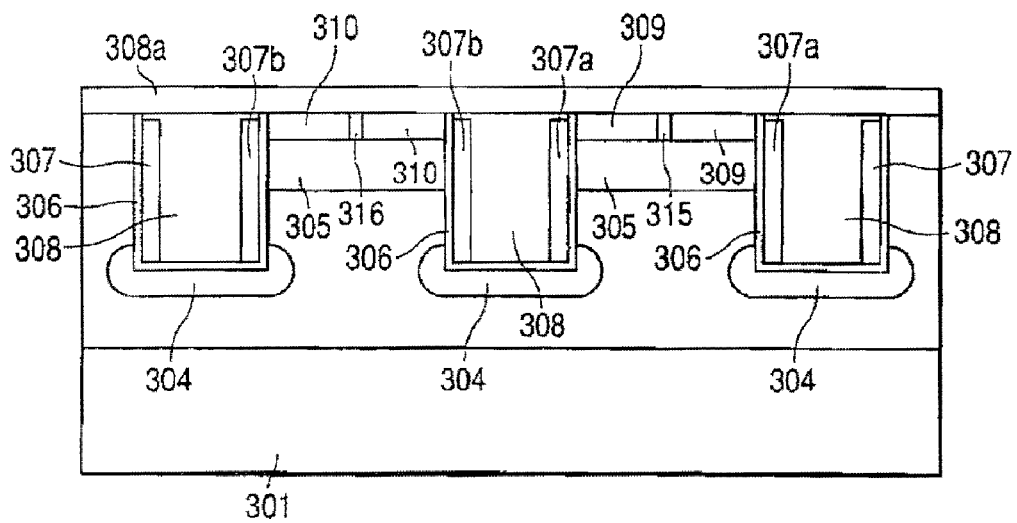
FIGS. 28A-28C schematically illustrate cross sections illustrating continuations of the sequence of FIGS. 27A-27C, where
Figure 28B:
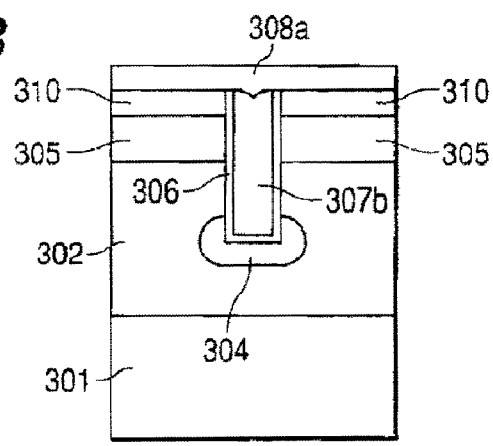
Figure 28C:
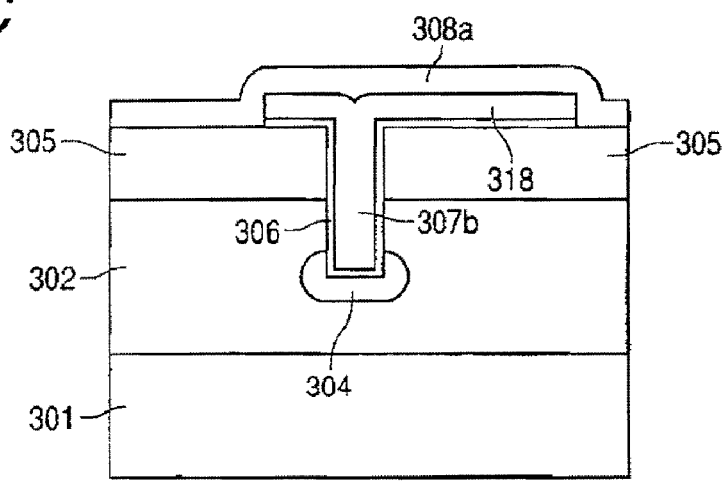

In FIGS. 28A-28C, first and second n-source regions 309 and 310 having a high concentration of more than $1 \times 10^{20}$ cm$^{-3}$ or more can be formed, using the first and second gate electrodes 307a and 307b as a mask. Heavily doped p-contact regions 316 extending through the first and second source regions 309 and 310 into the p-type offset regions 305 can be formed. An interlayer dielectric film 308a can be formed on the surface.

Figure 29A:
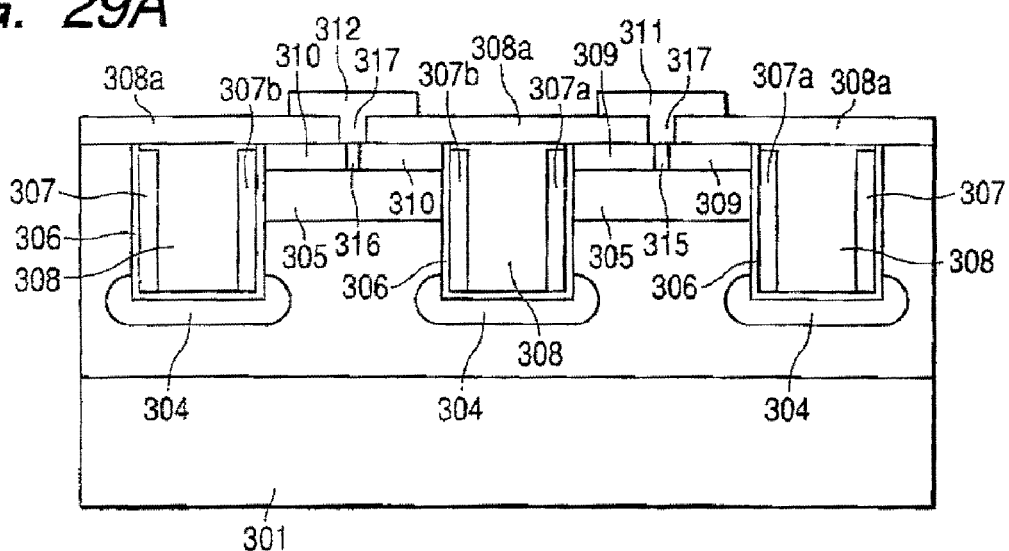
FIGS. 29A-29C schematically illustrate cross sections illustrating continuations of the sequence of FIGS. 28A-28C, where
Figure 29B:
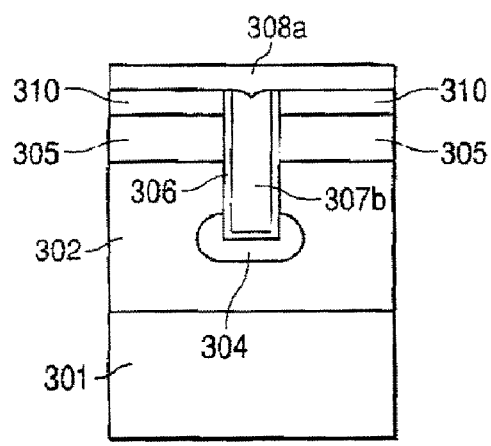
Figure 29C:
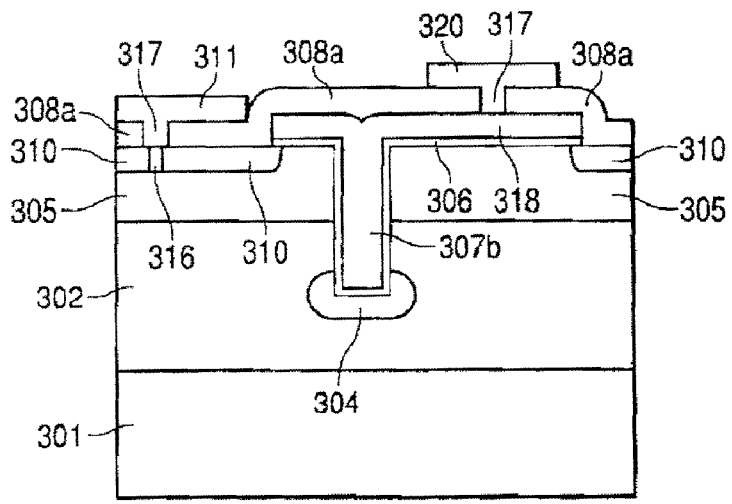
Figure 30:
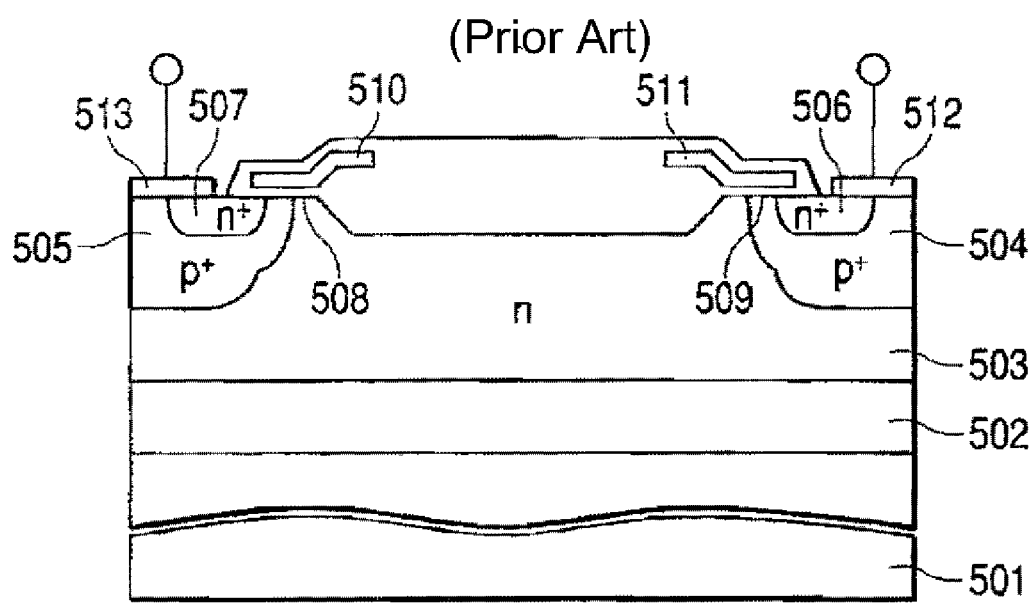
FIG. 30 schematically illustrates a cross section of a main portion of a related art bidirectional LIGBT.
Figure 31:
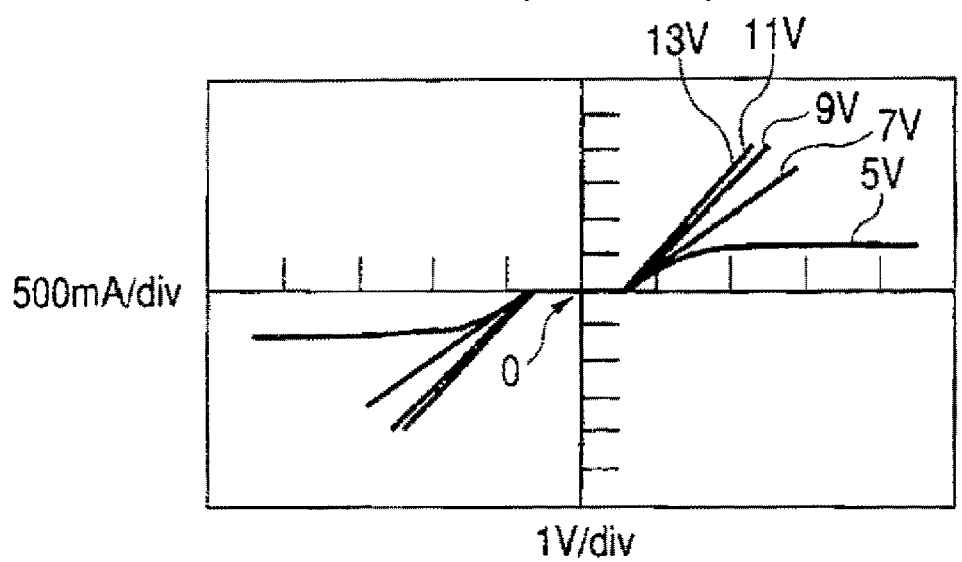
FIG. 31 schematically illustrates a diagram showing the output characteristics of the bidirectional LIGBT of FIG. 30.
Figure 32:
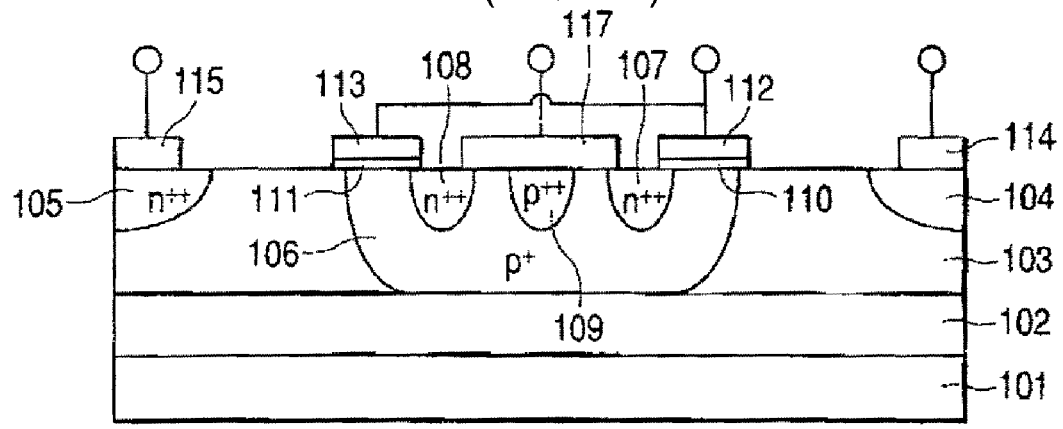
FIG. 32 schematically illustrates a cross section of the main portions of another related art bidirectional MOSFET.
Figure 33:
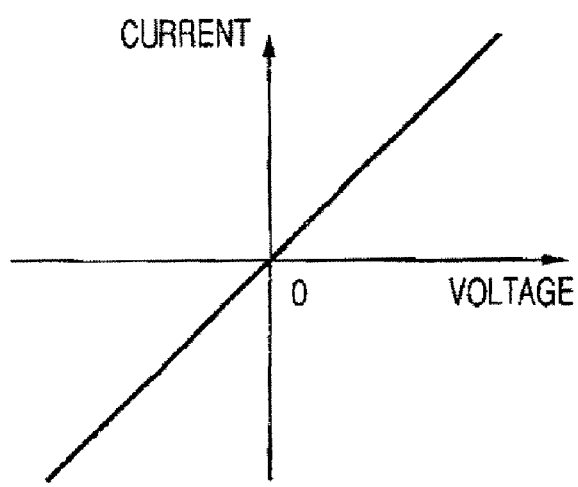
FIG. 33 schematically illustrates a diagram showing the output characteristics of the bidirectional LIGBT of FIG. 32.

In FIGS. 29A-29C, contact holes 317 can be formed in the interlayer dielectric film 308a. First and second source electrodes 311, 312 of a metal, first and second source interconnects 313, 314 formed simultaneously with the first and second source electrodes 311, 312, and first and second gate interconnects 319, 320 of a metal can be formed. Through the contact holes 317, the first and second source electrodes 311, 312 can be connected with first and second n-source regions 309, 310 and with p-contact regions 315, 316, and the first and second gate interconnects 319, 320 can be connected with polysilicon interconnects 318 formed simultaneously with the first and second gate electrodes 307a and 307b.

Where the thickness of the polysilicon of the gate electrodes and other components is set to about 0.3 µm, the space W1 is preferably set equal to or greater than 1 µm. To planarize the surface, the space W1 is preferably set to below the width of the islands. Furthermore, the spaces Wg1 and Wg2 can be preferably equally set to below 0.5 µm.

According to the present invention, the trenches can be formed in a semiconductor substrate and gate electrodes can be formed on the sidewalls of the trenches. A drain region can be formed under the bottom surface of each trench. A dielectric film can be formed over the drain region. First and second source regions can be formed in the semiconductor region surrounded by the trenches. As a result, the breakdown voltage of the bidirectional device can be increased, and the ON voltage can be reduced. The safely operating region of the bidirectional device can be made wider. Additionally, the breakdown voltage of the bidirectional device can be increased and the ON voltage can be reduced by forming trenches in a semiconductor substrate, forming gate electrodes on the sidewalls of the trenches, forming floating source/drain regions under the bottom surfaces of the trenches, forming a dielectric film over the source regions, and forming first and second drain/source regions in the semiconductor regions surrounded by the trenches. Moreover, the safely operating region of the bidirectional device can be made wider by forming source/drain regions and base pick-up regions under the bottom surfaces of the trenches and forming metal electrodes over them.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosure of the priority application, JP 2004-038698, in its entirety, including the drawings, claims, and the specifications thereof, is incorporated herein by reference.

What is claimed is:

1. A semiconductor device comprising:
    a semiconductor substrate of a second conductivity type;
    a bidirectional semiconductor device and a control circuit of the bidirectional semiconductor device integrated with the semiconductor substrate,
    wherein the bidirectional semiconductor device comprises:
    a well region of a first conductivity type selectively formed on one surface side of the semiconductor substrate, and having a predetermined depth from a surface thereof;
    a trench located in the well region;
    a first semiconductor region of the second conductivity type and a second semiconductor region of the second conductivity type located in a surface region of the well region respectively, wherein the first semiconductor region and the second semiconductor region are separated by the trench and the well region and in contact with the trench;
    a third semiconductor region of the first conductivity type located in a surface region of the first semiconductor region and contacting with the trench;
    a fourth semiconductor region of the first conductivity type located in a surface region of the second semiconductor region and contacting with the trench;
    a fifth semiconductor region of the second conductivity type located in a surface region of the first semiconductor region;
    a sixth semiconductor region of the second conductivity type located in a surface region of the second semiconductor region;
    a first control electrode located on an insulating film on the first semiconductor region between the well region of a side wall of the trench and the third semiconductor region;
    a second control electrode located on an insulating film on the second semiconductor region between the well region of a side wall of the trench and the fourth semiconductor region, apart from the first control electrode;
    a first main electrode contacting with the third semiconductor region and the fifth semiconductor region;
    a second main electrode contacting with the fourth semiconductor region and the sixth semiconductor region;
    a first MOSFET in which the well region is a drain and the third semiconductor region is a source; and
    a second MOSFET in which the well region is a drain and the fourth semiconductor region is a source,
    wherein the first MOSFET and the second MOSFET are connected to each other in series, and
    wherein the bidirectional semiconductor device allows electric current to flow between the first main electrode and the second main electrode.

2. The semiconductor device according to claim 1, wherein the control circuit has:
    a well of a second conductivity type formed on one surface side of the semiconductor substrate;
    a source of a first conductivity type and a drain of the first conductivity type, wherein the source and the drain are located on a surface of the well separated from each other; and
    a gate electrode located on an insulating film on a surface of the well between the source and the drain,
    wherein both the source and drain are formed on the one surface side of the semiconductor substrate.

3. The semiconductor device according to claim 1, wherein the first control electrode and the second control electrodes are electrically isolated.

* * * * *